(12) United States Patent
Murakami et al.

(10) Patent No.: US 7,867,873 B2
(45) Date of Patent: Jan. 11, 2011

(54) MANUFACTURING METHOD OF A SEMICONDUCTOR SUBSTRATE USING A DAMAGED REGION

(75) Inventors: Satoshi Murakami, Atsugi (JP); Hiromichi Godo, Atsugi (JP); Atsuo Isobe, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/213,037

(22) Filed: Jun. 13, 2008

(65) Prior Publication Data

US 2009/0004822 A1 Jan. 1, 2009

(30) Foreign Application Priority Data

Jun. 26, 2007 (JP) ............................. 2007-167356

(51) Int. Cl.
*H01L 21/30* (2006.01)
*H01L 21/46* (2006.01)

(52) U.S. Cl. ............... 438/455; 438/458; 257/E21.134; 257/E21.413; 257/E21.415

(58) Field of Classification Search ................. 438/455, 438/458; 257/E21.134, 413, 415
See application file for complete search history.

(56) References Cited

U.S. PATENT DOCUMENTS

| | | | | |
|---|---|---|---|---|
| 5,223,080 | A * | 6/1993 | Ohta et al. ...................... 216/2 |
| 5,374,564 | A | 12/1994 | Bruel | |
| 6,176,922 | B1 * | 1/2001 | Aklufi et al. ................... 117/4 |
| 6,271,101 | B1 | 8/2001 | Fukunaga | |
| 6,335,231 | B1 | 1/2002 | Yamazaki et al. | |
| 6,372,609 | B1 | 4/2002 | Aga et al. | |
| 6,380,046 | B1 | 4/2002 | Yamazaki | |
| 6,534,380 | B1 * | 3/2003 | Yamauchi et al. ........... 438/455 |
| 6,548,370 | B1 | 4/2003 | Kasahara et al. | |
| 6,602,761 | B2 | 8/2003 | Fukunaga | |
| 6,803,264 | B2 | 10/2004 | Yamazaki et al. | |
| 6,803,296 | B2 | 10/2004 | Miyairi | |
| 6,875,633 | B2 | 4/2005 | Fukunaga | |

(Continued)

FOREIGN PATENT DOCUMENTS

JP 11-163363 6/1999

(Continued)

*Primary Examiner*—Thao X Le
*Assistant Examiner*—Eric W Jones
(74) *Attorney, Agent, or Firm*—Eric J. Robinson; Robinson Intellectual Property Law Office, P.C.

(57) ABSTRACT

A method of manufacturing a semiconductor substrate is demonstrated, which enables the formation of a single crystal semiconductor layer on a substrate having an insulating surface. The manufacturing method includes the steps of: ion irradiation of a surface of a single-crystal semiconductor substrate to form a damaged region; laser light irradiation of the single-crystal semiconductor substrate; formation of an insulating layer on the surface of the single-crystal semiconductor substrate; bonding the insulating layer with a substrate having an insulating surface; separation of the single-crystal semiconductor substrate at the damaged region, resulting in a thin single-crystal semiconductor layer on the surface of the substrate having the insulating surface; and laser light irradiation of the surface of the single-crystal semiconductor layer which is formed on the substrate having the insulating surface. This method allows the production of a thin layer of a single-crystal semiconductor with uniformed characteristics on an insulating surface.

40 Claims, 17 Drawing Sheets

U.S. PATENT DOCUMENTS

| | | | |
|---|---|---|---|
| 6,887,650 B2 * | 5/2005 | Shimoda et al. | 430/311 |
| 7,050,387 B2 * | 5/2006 | Tsujita et al. | 369/283 |
| 7,119,365 B2 | 10/2006 | Takafuji et al. | |
| 7,148,124 B1 * | 12/2006 | Usenko | 438/458 |
| 7,176,525 B2 | 2/2007 | Fukunaga | |
| 7,199,024 B2 | 4/2007 | Yamazaki | |
| 7,338,913 B2 | 3/2008 | Kasahara et al. | |
| 2003/0203656 A1 | 10/2003 | Kasahara et al. | |
| 2004/0038505 A1 * | 2/2004 | Ito et al. | 438/520 |
| 2004/0224449 A1 * | 11/2004 | Yamazaki et al. | 438/166 |
| 2005/0009252 A1 | 1/2005 | Yamazaki et al. | |
| 2005/0042798 A1 * | 2/2005 | Nagao et al. | 438/71 |
| 2006/0068563 A1 * | 3/2006 | Wong et al. | 438/455 |
| 2007/0108510 A1 | 5/2007 | Fukunaga | |
| 2007/0173000 A1 | 7/2007 | Yamazaki | |
| 2007/0184632 A1 | 8/2007 | Yamazaki et al. | |
| 2007/0281440 A1 * | 12/2007 | Cites et al. | 438/458 |
| 2008/0261376 A1 | 10/2008 | Yamazaki et al. | |

FOREIGN PATENT DOCUMENTS

| | | |
|---|---|---|
| JP | 2000-294754 | 10/2000 |
| JP | 2001-127304 | 5/2001 |
| JP | 2005-203596 | 7/2005 |
| JP | 2005-252244 | 9/2005 |

* cited by examiner

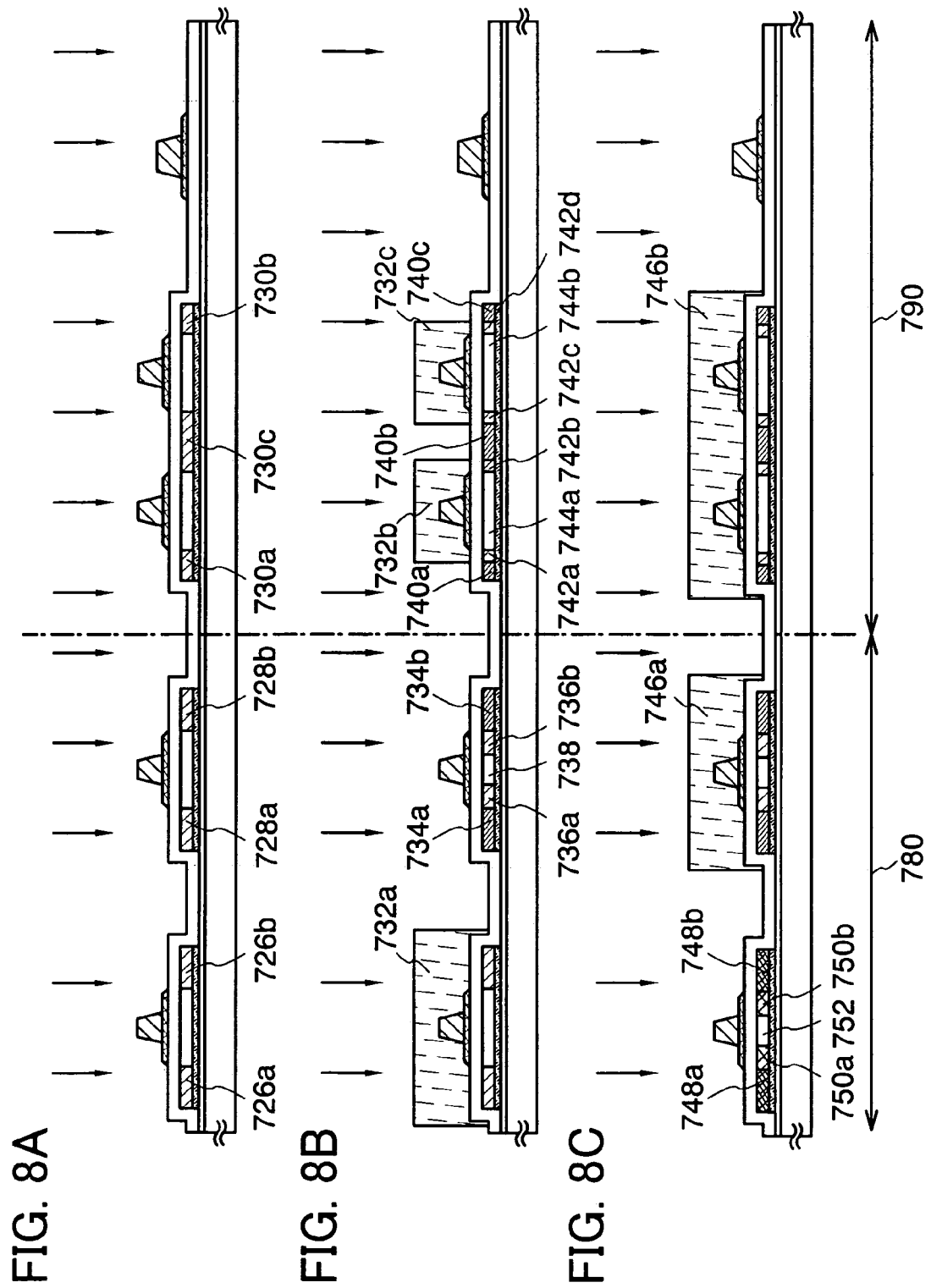

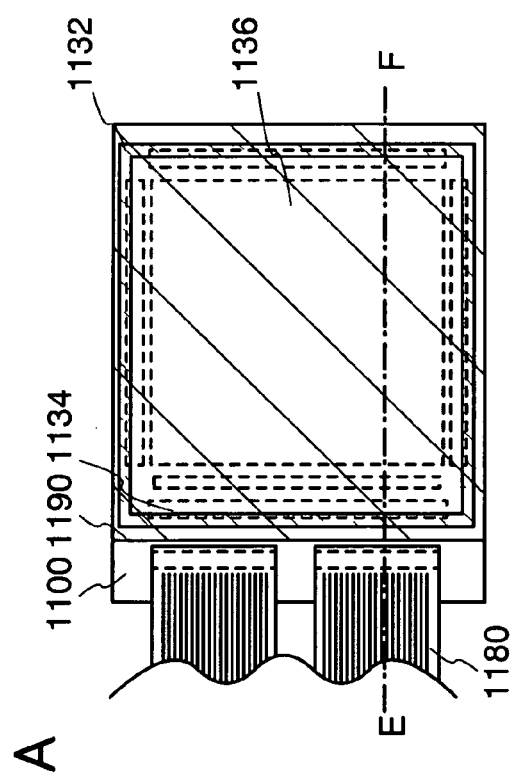
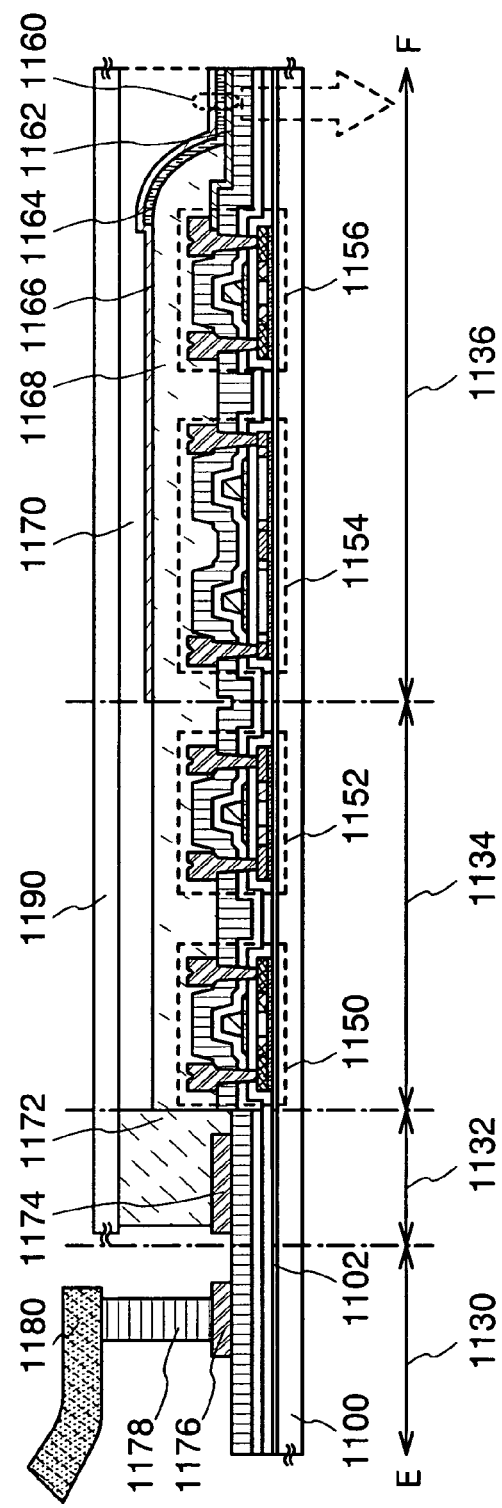
FIG. 11A
FIG. 11B

MANUFACTURING METHOD OF A SEMICONDUCTOR SUBSTRATE USING A DAMAGED REGION

BACKGROUND OF THE INVENTION

1. Field of the Invention

The present invention relates to a semiconductor substrate, a manufacturing method of a semiconductor substrate, and a semiconductor device and an electronic device using the semiconductor substrate.

2. Description of the Related Art

In recent years, as an alternative to a single-crystal silicon substrate which is manufactured by thinly slicing an ingot of single-crystal silicon, development of an integrated circuit using a silicon-on-insulator (SOI) substrate has been advanced. An SOI substrate has a structure in which a thin single-crystal silicon layer is provided on an insulating surface. As compared to the case of using a single-crystal silicon substrate, parasitic capacitance between a drain of a transistor and the substrate can be reduced and the performance of the semiconductor integrated circuit can be improved.

There are various manufacturing methods of an SOI substrate, and a method called Smart Cut (registered trademark) is known as a method in which both quality and productivity (throughput) of a formed single-crystal semiconductor layer are balanced. In Smart Cut, hydrogen ions are implanted into a single-crystal silicon substrate (bond wafer) and then the single-crystal silicon substrate is bonded to another substrate (base wafer) at a room temperature. The two substrates are bonded to each other by forming a strong bond utilizing van der Waals force. After that, heat treatment is performed at a temperature of approximately 500° C., so that the single-crystal silicon substrate is separated at a region where hydrogen ions are implanted, and a single-crystal silicon layer is left over another substrate (base wafer).

As an example of a technique of forming a single-crystal silicon thin film over a glass substrate by such Smart Cut, a technique by the present applicant has been known (for example, Patent Document 1: Japanese Published Patent Application No. H11-163363).

In Patent Document 1, an insulating film is formed over a glass substrate, thereby preventing contamination of a single-crystal silicon layer; thus, a semiconductor device having high performance is successfully provided.

SUMMARY OF THE INVENTION

Meanwhile, there is a case in which the single-crystal semiconductor layer thus formed is irradiated with laser light. For example, as illustrated in FIG. 16A, a single-crystal silicon thin film 1602 is formed over a glass substrate 1600 and then the single-crystal silicon thin film 1602 is irradiated with laser light 1604, so that planarity of the surface can be further improved. In addition to improvement of planarity, the damage of the single-crystal silicon thin film due to ion introduction can also be recovered. Note that in FIGS. 16A and 16B, a stacked-layer structure other than the glass substrate 1600 and the single-crystal silicon thin film 1602 is omitted for simplification.

As described above, in irradiating the single-crystal silicon thin film with laser light, there are some points to be noted. One point is intensity of laser light. When the single-crystal silicon thin film is irradiated with laser light, a region irradiated with the laser light is melted. Then, it is considered that upon the termination of laser light irradiation, the melted region recrystallizes, and a region which is not melted serves as a crystal nucleus. Here, in the case where the intensity of the laser light is excessive, a single-crystal silicon thin film is entirely melted. In this case, since single-crystal silicon which serves as a crystal nucleus does not exist, single-crystal silicon cannot be obtained by recrystallization. Therefore, in an attempt to improve the characteristic of a single-crystal silicon thin film by laser light irradiation, it is necessary to adjust the intensity of laser light so that a single-crystal silicon thin film is not entirely melted in a region which is irradiated with laser light.

Here, the variation which occurs in the laser light irradiation of a single-crystal silicon thin film illustrated in FIG. 16A is discussed in detail. In FIG. 16B, a single-crystal silicon thin film 1602 is formed over a glass substrate 1600. Here, a bottom portion 1606 of the single-crystal silicon thin film 1602 is a region which is not melted by laser light irradiation, and a top portion 1608 is a region which is melted by laser light irradiation and recrystallized. When the bottom portion 1606 and the top portion 1608 are compared, in the top portion 1608, crystallinity is recovered and activation of a slight amount of an impurity element due to ion introduction is progressed. On the other hand, in the bottom portion 1606, crystallinity is recovered less than that in the top portion 1608, and activation of an impurity element does not progress as much as in the top portion 1608. Note that recovery of crystallinity refers to reduction of crystal defects.

When a semiconductor element is formed using such a silicon thin film having regions of different characteristics, a semiconductor element having favorable characteristics cannot be obtained. For example, a case in which an n-channel top-gate transistor 1750 is formed over a glass substrate 1700 which is illustrated in FIG. 17A is considered. The transistor 1750 includes a single-crystal silicon thin film having a bottom portion 1702 which is not melted by laser light irradiation and a top portion 1704 which is melted by laser light irradiation and recrystallized; a gate insulating film 1706 which is formed to cover the single-crystal silicon thin film; and a gate electrode 1708 over the gate insulating film 1706. Note that in FIGS. 17A to 17C, part of a stacked-layer structure is omitted for simplification. In addition, FIG. 17A corresponds to a cross section taken along line A-B in FIG. 17B. Note that the transistor 1750 includes a source or drain electrode 1712 and a source or drain electrode 1714 (see FIG. 17B).

The single-crystal silicon thin film can be considered to be formed of two layers of silicon thin films (the bottom portion 1702 and the top portion 1704) of different characteristics (crystallinity, whether an impurity element is activated, and the like). In this case, particularly an edge portion 1710 of the transistor 1750 is strongly influenced by the bottom portion 1702. Therefore, in a drain current ($I_d$)-gate voltage ($V_g$) curve of the transistor 1750 using a single-crystal silicon thin film, $I_d$-$V_g$ characteristics of two different transistors appear (see FIG. 17C, $I_d$ is logarithmic display). Note that the $I_d$-$V_g$ curve illustrated in FIG. 17C is not a curve in consideration of details of a contribution ratio between the bottom portion 1702 and the top portion 1704, or the like. Definitely, the $I_d$-$V_g$ curve of the transistor 1750 is not always the $I_d$-$V_g$ curve illustrated in FIG. 17C.

When laser light irradiation is performed in this manner, while an advantageous effect such as improvement of planarity or recovery of crystallinity can be obtained, a semiconductor layer having different characteristics is formed; thus, it is difficult to form a favorable semiconductor element.

In view of the problem as described above, it is an object of the present invention to provide a semiconductor substrate, in which favorable characteristics that solves the problem due to laser light irradiation, can be obtained. Further, it is another object of the present invention to provide a semiconductor device and an electronic device using the semiconductor substrate.

In the present invention, after a single-crystal semiconductor substrate is irradiated with ions to perform ion introduction (also referred to as implantation or doping), the surface of the single-crystal semiconductor substrate is irradiated with laser light. Then, the single-crystal semiconductor substrate is bonded to a substrate having an insulating surface and is separated at a region where the ions are introduced. Accordingly, a single-crystal semiconductor layer is formed over the substrate having an insulating surface. After that, the single-crystal semiconductor layer is irradiated with laser light, so that a semiconductor substrate in which characteristics of a single-crystal semiconductor layer are uniformed can be provided.

In addition, in the present invention, after a single-crystal semiconductor substrate is irradiated with ions to perform ion introduction (also referred to as implantation or doping), the single-crystal semiconductor substrate is bonded to a substrate having an insulating surface and is separated at a region where the ions are introduced. The single-crystal semiconductor layer thus formed is irradiated with laser light from one side and then from another side. Accordingly, a semiconductor substrate in which characteristics of a single-crystal semiconductor layer are uniformed can be provided.

According to one feature of the present invention, a method for manufacturing a semiconductor substrate includes the steps of: forming a damaged region by ion irradiation of a surface of a single-crystal semiconductor substrate; irradiating the surface of the single-crystal semiconductor substrate with laser light; forming an insulating layer on the surface of the single-crystal semiconductor substrate; bonding the insulating layer and a substrate having an insulating surface to each other; forming a single-crystal semiconductor layer over the substrate having an insulating surface by separation of the single-crystal semiconductor substrate in the damaged region; and irradiating a surface of the single-crystal semiconductor layer with laser light.

According to another feature of the present invention, a method for manufacturing a semiconductor substrate includes the steps of: forming a damaged region by ion irradiation of a surface of a single-crystal semiconductor substrate; irradiating the surface of the single-crystal semiconductor substrate with laser light; forming an insulating layer on a surface of a substrate having an insulating surface; bonding the insulating layer and the single-crystal semiconductor substrate to each other; forming a single-crystal semiconductor layer over the substrate having an insulating surface by separation of the single-crystal semiconductor substrate in the damaged region; and irradiating a surface of the single-crystal semiconductor layer with laser light.

According to another feature of the present invention, a method for manufacturing a semiconductor substrate includes the steps of: forming a damaged region by ion irradiation of a surface of a single-crystal semiconductor substrate; forming an insulating layer on the surface of the single-crystal semiconductor substrate; bonding the insulating layer and a substrate having an insulating surface to each other; forming a single-crystal semiconductor layer over the substrate having an insulating surface by separation of the single-crystal semiconductor substrate in the damaged region; irradiating one surface of the single-crystal semiconductor layer with first laser light; and irradiating another surface of the single-crystal semiconductor layer with second laser light.

According to another feature of the present invention, a method for manufacturing a semiconductor substrate includes the steps of: forming a damaged region by ion irradiation of a surface of a single-crystal semiconductor substrate; forming an insulating layer on a surface of a substrate having an insulating surface; bonding the insulating layer and the single-crystal semiconductor substrate to each other; forming a single-crystal semiconductor layer over the substrate having an insulating surface by separation of the single-crystal semiconductor substrate in the damaged region; irradiating one surface of the single-crystal semiconductor layer with first laser light; and irradiating another surface of the single-crystal semiconductor layer with second laser light.

In any of the above-described structures, the insulating layer is preferably formed by a chemical vapor deposition method, using an organic silane gas.

According to another feature of the present invention, a method for manufacturing a semiconductor substrate includes the steps of: forming a first insulating layer on a surface of a single-crystal semiconductor substrate; forming a damaged region in the single-crystal semiconductor substrate by ion irradiation of a surface of the first insulating layer; irradiating the surface of the single-crystal semiconductor substrate with laser light through the first insulating layer; forming a second insulating layer on the surface of the first insulating layer; bonding the second insulating layer and a substrate having an insulating surface to each other; forming a single-crystal semiconductor layer over the substrate having an insulating surface by separation of the single-crystal semiconductor substrate in the damaged region; and irradiating a surface of the single-crystal semiconductor layer with laser light.

According to another feature of the present invention, a method for manufacturing a semiconductor substrate includes the steps of: forming a first insulating layer on a surface of a single-crystal semiconductor substrate; forming a damaged region in the single-crystal semiconductor substrate by ion irradiation of a surface of the first insulating layer; irradiating the surface of the single-crystal semiconductor substrate with laser light through the first insulating layer; forming a second insulating layer on a surface of a substrate having an insulating surface; bonding the second insulating layer and the first insulating layer to each other; forming a single-crystal semiconductor layer over the substrate having an insulating surface by separation of the single-crystal semiconductor substrate in the damaged region; and irradiating a surface of the single-crystal semiconductor layer with laser light.

According to another feature of the present invention, a method for manufacturing a semiconductor substrate includes the steps of: forming a damaged region by ion irradiation of a surface of a single-crystal semiconductor substrate; forming a first insulating layer on the surface of the single-crystal semiconductor substrate; irradiating the surface of the single-crystal semiconductor substrate with laser light through the first insulating layer; forming a second insulating layer on a surface of the first insulating layer; bonding the second insulating layer and a substrate having an insulating surface to each other; forming a single-crystal semiconductor layer over the substrate having an insulating surface by separation of the single-crystal semiconductor substrate in the damaged region; and irradiating a surface of the single-crystal semiconductor layer with laser light.

According to another feature of the present invention, a method for manufacturing a semiconductor substrate includes the steps of: forming a damaged region by ion irradiation of a surface of a single-crystal semiconductor substrate; forming a first insulating layer on the surface of the single-crystal semiconductor substrate; irradiating the surface of the single-crystal semiconductor substrate with laser light through the first insulating layer; forming a second insulating layer on a surface of a substrate having an insulating surface; bonding the second insulating layer and the first insulating layer to each other; forming a single-crystal semiconductor layer over the substrate having an insulating surface by separation of the single-crystal semiconductor substrate in the damaged region; and irradiating a surface of the single-crystal semiconductor layer with laser light.

According to another feature of the present invention, a method for manufacturing a semiconductor substrate includes the steps of: forming a damaged region by ion irradiation of a surface of a single-crystal semiconductor substrate; irradiating the surface of the single-crystal semiconductor substrate with laser light; forming a first insulating layer on the surface of the single-crystal semiconductor substrate; forming a second insulating layer on a surface of the first insulating layer; bonding the second insulating layer and a substrate having an insulating surface to each other; forming a single-crystal semiconductor layer over the substrate having an insulating surface by separation of the single-crystal semiconductor substrate in the damaged region; and irradiating a surface of the single-crystal semiconductor layer with laser light.

According to another feature of the present invention, a method for manufacturing a semiconductor substrate includes the steps of: forming a damaged region by ion irradiation of a surface of a single-crystal semiconductor substrate; irradiating the surface of the single-crystal semiconductor substrate with laser light; forming a first insulating layer on the surface of the single-crystal semiconductor substrate; forming a second insulating layer on a surface of a substrate having an insulating surface; bonding the second insulating layer and the first insulating layer to each other; forming a single-crystal semiconductor layer over the substrate having an insulating surface by separation of the single-crystal semiconductor substrate in the damaged region; and irradiating a surface of the single-crystal semiconductor layer with laser light.

According to another feature of the present invention, a method for manufacturing a semiconductor substrate includes the steps of: forming a first insulating layer on a surface of a single-crystal semiconductor substrate; forming a damaged region in the single-crystal semiconductor substrate by ion irradiation of a surface of the first insulating layer; forming a second insulating layer on the surface of the first insulating layer; bonding the second insulating layer and a substrate having an insulating surface to each other; forming a single-crystal semiconductor layer over the substrate having an insulating surface by separation of the single-crystal semiconductor substrate in the damaged region; irradiating one surface of the single-crystal semiconductor layer with first laser light; and irradiating another surface of the single-crystal semiconductor layer with second laser light.

According to another feature of the present invention, a method for manufacturing a semiconductor substrate includes the steps of: forming a first insulating layer on a surface of a single-crystal semiconductor substrate; forming a damaged region in the single-crystal semiconductor substrate by ion irradiation of a surface of the first insulating layer; forming a second insulating layer on a surface of a substrate having an insulating surface; bonding the second insulating layer and the first insulating layer to each other; forming a single-crystal semiconductor layer over the substrate having an insulating surface by separation of the single-crystal semiconductor substrate in the damaged region; irradiating one surface of the single-crystal semiconductor layer with first laser light; and irradiating another surface of the single-crystal semiconductor layer with second laser light.

According to another feature of the present invention, a method for manufacturing a semiconductor substrate includes the steps of: forming a damaged region by ion irradiation of a surface of a single-crystal semiconductor substrate; forming a first insulating layer on the surface of the single-crystal semiconductor substrate; forming a second insulating layer on a surface of the first insulating layer; bonding the second insulating layer and a substrate having an insulating surface to each other; forming a single-crystal semiconductor layer over the substrate having an insulating surface by separation of the single-crystal semiconductor substrate in the damaged region; irradiating one surface of the single-crystal semiconductor layer with first laser light; and irradiating another surface of the single-crystal semiconductor layer with second laser light.

According to another feature of the present invention, a method for manufacturing a semiconductor substrate includes the steps of: forming a damaged region by ion irradiation of a surface of a single-crystal semiconductor substrate; forming a first insulating layer on the surface of the single-crystal semiconductor substrate; forming a second insulating layer on a surface of a substrate having an insulating surface; bonding the second insulating layer and the first insulating layer to each other; forming a single-crystal semiconductor layer over the substrate having an insulating surface by separation of the single-crystal semiconductor substrate in the damaged region; irradiating one surface of the single-crystal semiconductor layer with first laser light; and irradiating another surface of the single-crystal semiconductor layer with second laser light.

In any of the above-described structures, the first insulating layer may be formed in a stacked-layer structure. In addition, the first insulating layer may be formed in a stacked-layer structure of a silicon oxynitride layer and a silicon nitride oxide layer, in which the silicon oxynitride layer may be formed so as to be in contact with the single-crystal semiconductor substrate.

In any of the above-described structures, the second insulating layer is preferably formed by a chemical vapor deposition method, using an organic silane gas. In addition, after ion irradiation, heat treatment may be performed at a temperature approximately at which separation does not occur (for example, greater than or equal to 100° C. and less than or equal to 400° C.).

A semiconductor substrate can be provided using any of the above-described methods.

In addition, various semiconductor devices and electronic devices can be provided using any of the above-described semiconductor substrates.

Note that in the present invention, a semiconductor device refers to a display device such as a liquid crystal display device and an electroluminescence display device; a wireless tag which is referred to as an RFID (radio frequency identification) tag, an RF tag, an RF chip, a wireless processor, a wireless memory, an IC (integrated circuit) tag, an IC label, an electronic tag, or an electronic chip; a microprocessor such as a central processing unit (CPU); an integrated circuit; and any other semiconductor device using a single-crystal semiconductor layer which is formed on an insulating surface.

According to the present invention, a semiconductor substrate in which characteristics of a single-crystal semiconductor layer are uniformed can be provided. Accordingly, a semiconductor device and an electronic device using a semiconductor element having favorable characteristics can be provided.

BRIEF DESCRIPTION OF THE DRAWINGS

In the accompanying drawings:

FIGS. 8A to 8C are cross-sectional views illustrating a manufacturing process of a semiconductor device of the present invention;

FIGS. 11A and 11B are a plan view and a cross-sectional view of a semiconductor device of the present invention, respectively;

DETAILED DESCRIPTION OF THE INVENTION

Embodiment Mode

Figure 1A:
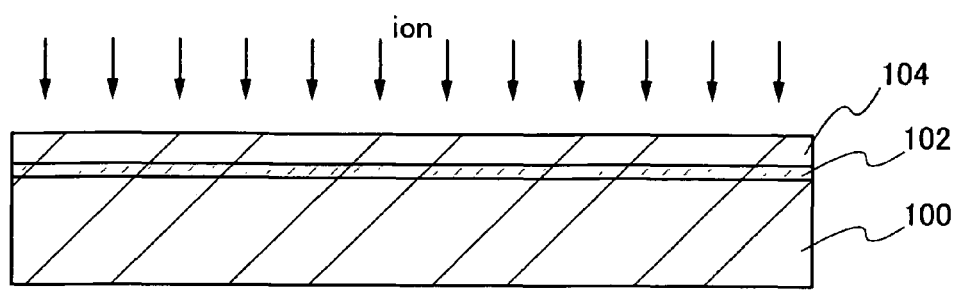
FIGS. 1A to 1D are cross-sectional views illustrating a manufacturing process of a semiconductor substrate of the present invention.

Embodiment modes of the present invention will be hereinafter described with reference to the drawings. However, the present invention is not limited to descriptions below, and it is easily understood by those skilled in the art that modes and details can be modified in various ways without departing from the purpose and the scope of the present invention. Therefore, unless such changes and modifications depart from the purport and the scope of the present invention, they should be construed as being included therein. Note that reference numerals denoting the identical portions are the same in all figures.

Embodiment Mode 1

This embodiment mode will describe an example of a manufacturing method of a semiconductor substrate of the present invention with reference to FIGS. 1A to 1D, FIGS. 2A to 2C, and FIGS. 3A to 3D.

First, a single-crystal semiconductor substrate 100 is prepared. Then, the surface of the single-crystal semiconductor substrate 100 is irradiated with ions and the ions are introduced to a predetermined depth from the surface of the single-crystal semiconductor substrate 100 to form a damaged region 102 and a single-crystal semiconductor layer 104 (see FIG. 1A). As a method for forming the damaged region 102, a method used for adding an impurity element to a semiconductor layer (hereinafter referred to as an ion doping method), a method for performing mass separation of an ionized gas to be selectively implanted into a semiconductor layer (hereinafter referred to as an ion implantation method), and the like can be given. Ion irradiation may be performed in consideration of the thickness of the single-crystal semiconductor layer 104 which is formed. The thickness of the single-crystal semiconductor layer 104 may be approximately 5 to 500 nm, and 10 to 200 nm is more preferable. An accelerating voltage at ion irradiation can be determined in consideration of the above-described thickness of the single-crystal semiconductor layer 104.

The single-crystal semiconductor substrate 100 is not particularly limited as long as it is a substrate made of a single-crystal semiconductor material, and a single-crystal silicon substrate can be used, as an example. Alternatively, a substrate made of a compound semiconductor such as germanium, gallium arsenide, or indium phosphide can be applied. Hereinafter, the case in which a single-crystal silicon substrate is used as the single-crystal semiconductor substrate 100 is described.

As ions for irradiation, ions of hydrogen, helium, halogen typified by fluorine, and the like can be given. When fluorine ion is used as halogen ions for irradiation, $BF_3$ may be used as a source gas. For example, when a single-crystal silicon substrate is used as the single-crystal semiconductor substrate 100 and the single-crystal silicon substrate is irradiated with halogen ions like fluorine ions, fine voids are formed in the damaged region 102. This is because the halogen ion, with which the single-crystal silicon substrate is irradiated, purges silicon atoms in a silicon crystal lattice. The volumes of the fine voids thus formed are changed, so that the single-crystal silicon substrate can be separated. Specifically, the volume change of the fine voids is induced by low-temperature heat treatment. Note that hydrogen ion irradiation may be performed to contain hydrogen in the voids after fluorine ion irradiation is performed.

Alternatively, the single-crystal silicon substrate may be irradiated with a plurality of ions of the same atom, in which the mass numbers are different. For example, hydrogen ion irradiation can be performed by using $H^+$, $H_2^+$, and $H_3^+$ ions, and it is preferable that the proportion of $H_3^+$ ions is increased. Increase in the proportion of $H_3^+$ results in increase in the irradiation efficiency; thus, the irradiation time can be shortened.

Figure 1B:
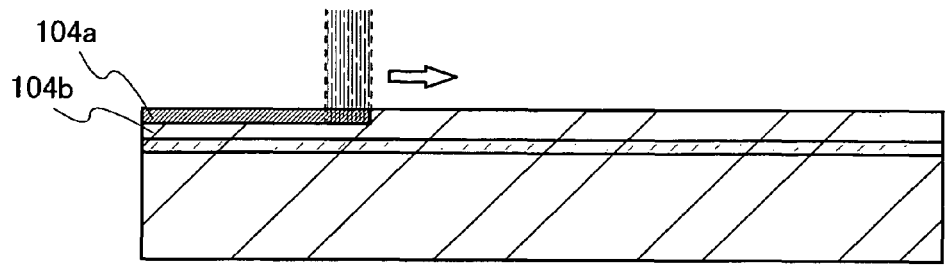

Next, the surface of the single-crystal semiconductor layer 104 is irradiated with laser light (see FIG. 1B). Accordingly, planarity of the single-crystal semiconductor layer 104 can be improved, and a first portion 104a is formed in the single-crystal semiconductor layer 104, in which the crystallinity is recovered. In addition, laser light irradiation of a second portion 104b, after the formation of single-crystal semiconductor layer 104 over a substrate having an insulating surface, allows the characteristics of the single-crystal semiconductor layer 104 to be uniformed. Note that laser light irradiation can be performed more effectively by heating the single-crystal semiconductor substrate 100 in laser light irradiation. A heat temperature in this case may be greater than or equal to 100° C. and less than or equal to 400° C. Note that heat treatment may be performed before laser light irradiation is performed.

As to the laser light irradiation, a continuous-wave laser (a CW laser), a pseudo-CW laser (a pulsed laser, the repetition rate of which is greater than or equal to 10 MHz, preferably greater than or equal to 80 MHz), or the like can be used, for example. Specifically, as the CW laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a helium cadmium laser, or the like can be used. As the pseudo-CW laser, a pulsed laser such as an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a copper vapor laser, or a gold vapor laser can be used. Such a pulsed laser can be treated in the same manner as that of a CW laser, as the repetition rate is increased.

Note that in this embodiment mode, as an example, laser light irradiation using an excimer laser is performed. Specifically, a KrF excimer laser (wavelength: 248 nm), a XeCl excimer laser (wavelength: 308 nm), or the like is used.

Figure 1C:
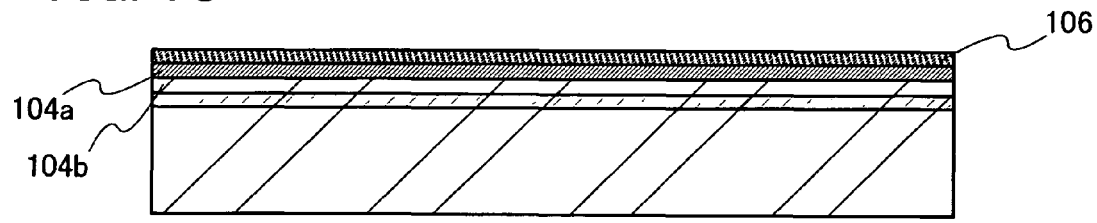

Next, a bonding layer 106 is formed over the single-crystal semiconductor layer 104 which is irradiated with laser light (see FIG. 1C). The bonding layer 106 may be formed of a silicon oxide film by a chemical vapor deposition method (CVD method), using an organic silane gas. Alternatively, a silicon oxide film which is formed by a chemical vapor deposition method, using a silane gas, can be applied. In the case of using a chemical vapor deposition method, it is necessary to perform deposition under a temperature condition in which degasification does not occur from the damaged region 102. Note that as to heat treatment for separating the single-crystal semiconductor layer 104 from the single-crystal semiconductor substrate 100, a temperature higher than a deposition temperature is applied. Further, since the bonding layer is formed with an insulating material, the bonding layer 106 can also be referred to as an insulating layer.

The surface of the bonding layer 106 is formed smoothly and has hydrophilicity. A silicon oxide film is appropriate as the bonding layer 106. In particular, a silicon oxide film which is formed by a chemical vapor deposition method, using an organic silane gas, is preferable. Examples of organic silane gas that can be used include silicon-containing compounds, such as tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

The above-described bonding layer 106 is provided with a thickness of approximately 5 to 500 nm. Accordingly, a surface of the first portion 104a on which the bonding layer 106 is formed can be smoothed, which simultaneously contributes to the improvement of the smoothness of a surface of the bonding layer 106. Note that a substrate 110 having an insulating surface can also be provided with a similar bonding layer. The single-crystal semiconductor substrate 100 and the substrate 110 having an insulating surface can be strongly bonded together by thus providing a silicon oxide film, which is deposited with organic silane as a raw material, for either one or both of the bonding surfaces.

Note that a nitrogen-containing insulating layer may be provided between the single-crystal semiconductor layer 104 and the bonding layer 106. The nitrogen-containing insulating layer can be formed using one or a plurality of materials selected from silicon nitride, silicon nitride oxide, or silicon oxynitride. Note that the nitrogen-containing insulating layer may have a single-layer structure or a stacked-layer structure. For example, a silicon oxynitride film and a silicon nitride oxide film can be stacked from a side of the single-crystal semiconductor layer 104 to obtain the nitrogen-containing insulating layer. The nitrogen-containing insulating layer is provided to prevent intrusion of impurities such as movable ions like alkali metal or alkaline earth metal or water into the single-crystal semiconductor layer 104. Note that an insulating layer other than the nitrogen-containing insulating layer may be provided as long as intrusion of impurities can be prevented.

Here, a silicon oxynitride film shows a film in which content of oxygen is larger than that of nitrogen and is exemplified by a film which includes oxygen, nitrogen, silicon, and hydrogen at concentrations ranging from greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0.1 at. % and less than or equal to 10 at. %, respectively. Further, a silicon nitride oxide film shows a film that has greater content of nitrogen than that of oxygen and includes oxygen, nitrogen, silicon, and hydrogen at concentrations ranging from greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. Note that the above-described element content is obtained by using Rutherford backscattering spectrometry (RBS) and hydrogen forward scattering (HFS). Moreover, the total for the content ratio of the constituent elements does not exceed 100 at. %.

Note that in this embodiment mode, ion irradiation is performed, the single-crystal semiconductor layer 104 is irradiated with laser light, and then the bonding layer 106 is provided; however, the present invention is not limited to this structure. As long as the strength of the bond can be kept above a certain value, a structure may be employed in which the bonding layer 106 is formed, ion irradiation is performed, and then laser light irradiation is performed. Alternatively, a structure may be employed in which ion irradiation is performed, the bonding layer 106 is formed, and then laser light irradiation is performed. As to the case of providing the nitrogen-containing insulating layer, the nitrogen-containing insulating layer may be provided before or after ion irradiation, in a similar manner. When the nitrogen-containing insulating layer is provided before ion irradiation, increase in surface roughness of the single-crystal semiconductor substrate 100 due to ion irradiation can be prevented.

Figure 1D:
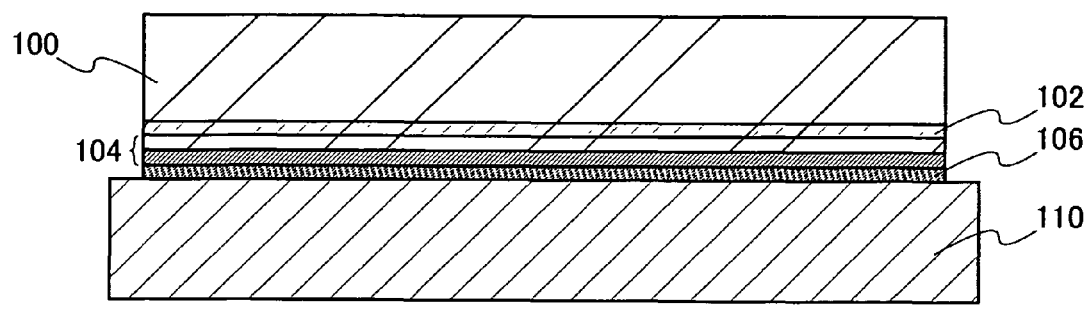

Next, the substrate 110 having an insulating surface and the bonding layer 106 are disposed in close contact with each other (see FIG. 1D). The substrate 110 having an insulating surface and the bonding layer 106 are disposed in close contact with each other and pressure is applied therebetween, so that the substrate and the bonding layer can be bonded firmly to each other by hydrogen bonds and covalent bonds. Note that it is preferable to perform heat treatment after the substrate 110 having an insulating surface and the single-crystal semiconductor substrate 100 are bonded to each other, with the bonding layer 106 interposed therebetween. The bonding strength can be further enhanced by performing heat treatment.

In order to form a strong bond, the surface which is bonded may be activated. For example, the surface which is bonded is irradiated with an atomic beam or an ion beam. When an atomic beam or an ion beam is used, an inert gas atomic beam or inert gas ion beam of argon or the like can be used. Alternatively, plasma treatment or radical treatment may be performed. Such surface treatment makes it possible to form a bond between different kinds of materials at a low temperature of approximately from 200 to 400° C.

As the substrate 110 having an insulating surface, any of various glass substrates which are used in the electronics industry such as an aluminosilicate glass substrate, an aluminoborosilicate glass substrate, and a barium borosilicate glass substrate; a quartz substrate; a ceramic substrate; a sapphire substrate; or the like can be used. A glass substrate is preferably used, and a mother glass substrate having a large area can be used, such as a so-called sixth generation substrate (1500 mm×1850 mm), a so-called seventh generation substrate (1870 mm×2200 mm), and a so-called eighth generation substrate (2200 mm×2400 mm), for example. A mother glass substrate having a large area is used as the substrate 110 having an insulating surface, so that the area of the semiconductor substrate can be enlarged. Note that the substrate 110 having an insulating surface is not limited to the above-described substrates. For example, a substrate made from a resin material can also be used if its heat-resistant temperature is higher than the maximum temperature of the process.

Figure 2A:
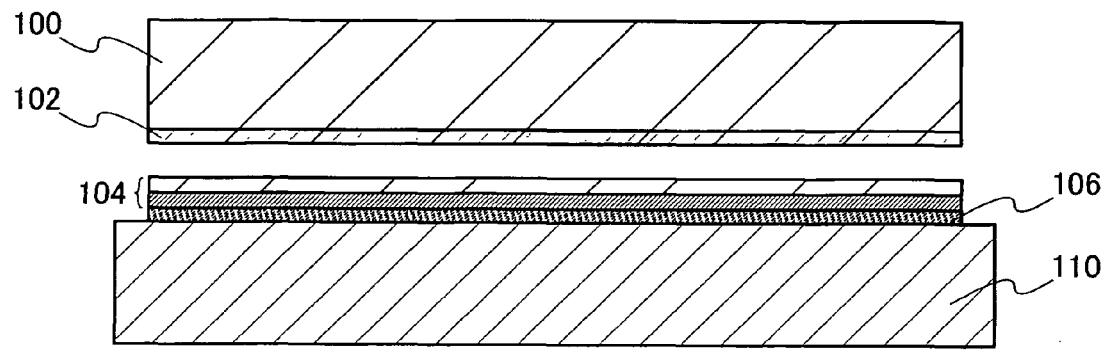
FIGS. 2A to 2C are cross-sectional views illustrating a manufacturing process of a semiconductor substrate of the present invention.

Next, heat treatment is performed to separate the single-crystal semiconductor layer 104 from the single-crystal semiconductor substrate 100 at the damaged region 102 (see FIG. 2A). For example, heat treatment is performed at 400 to 600° C., which induces the volume change of the fine voids formed in the damaged region 102, leading to the separation of the single-crystal semiconductor layer 104. Since the bonding layer 106 is bonded to the substrate 110 having an insulating surface, the single-crystal semiconductor layer 104 remains over the substrate 110 having an insulating surface.

When a glass substrate is used as the substrate 110 having an insulating surface, heat treatment may be performed approximately at a strain point of a glass substrate, specifically at a temperature in a range from minus 50° C. to plus 50° C. of the strain point. More specifically, heat treatment may be performed at a temperature greater than or equal to 580° C. and less than or equal to 680° C. Note that a glass substrate has a property of contraction by heat. Therefore, when a glass substrate is preheated approximately at a strain point, specifically at a temperature in a range from minus 50° C. to plus 50° C. of the strain point (or higher) in advance, contraction in subsequent heat treatment can be suppressed. Accordingly, even when heat treatment is performed on a glass substrate, to which a single-crystal semiconductor layer having a thermal expansion coefficient different from that of the glass substrate is bonded, separation of the bonded single-crystal semiconductor layer from the glass substrate can be prevented. Further, transformation such as a warp of the glass substrate and the single-crystal semiconductor layer can be prevented. Note that the preheating can be performed on any other substrates other than a glass substrate, as long as a substrate having a property of contraction in heating is used.

Note that when a glass substrate is used, it is preferable to avoid rapid cooling at the termination of heating. Specifically, the glass substrate may be cooled down to a temperature less than or equal to a strain point at a speed of less than or equal to 2° C./min, preferably less than or equal to 0.5° C./min, more preferably less than or equal to 0.3° C./min. The temperature reduction rate is reduced, so that local stress which is caused by the contraction of the glass substrate can be eased. The heat treatment may be performed under atmospheric pressure or under reduced pressure. As to an atmosphere, a nitrogen atmosphere, an oxygen atmosphere, or the like can be set, as appropriate.

Note that heat treatment related to the bonding step and heat treatment related to the separation step can be performed simultaneously. In this case, two steps can be performed simultaneously in a single heat treatment; therefore, a semiconductor substrate can be manufactured at low cost.

Figure 2B:
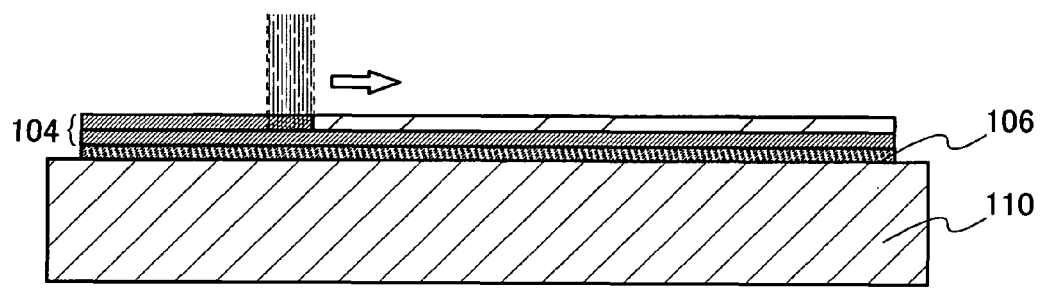

After that, the surface of the single-crystal semiconductor layer 104 is irradiated with laser light (see FIG. 2B). Accordingly, planarity of the single-crystal semiconductor layer 104 is improved; thus, crystallinity of the second portion 104b of the single-crystal semiconductor layer 104 can be recovered.

A laser which can be used for second laser light irradiation is similar to a laser which can be used for first laser light irradiation. In this embodiment mode, as an example, laser light irradiation using an excimer laser is performed. Specifically, a KrF excimer laser (wavelength: 248 nm), an XeCl excimer laser (wavelength: 308 nm), or the like is used.

Note that in the first laser light irradiation, temperature rise due to laser light irradiation must be suppressed to be less than a temperature at which separation at the damaged region occurs. On the other hand, in the second laser light irradiation, it is necessary to perform laser light irradiation at intensity approximately at which the entire single-crystal semiconductor does not melt. Therefore, it is important to set intensity of laser light, as appropriate.

Figure 2C:
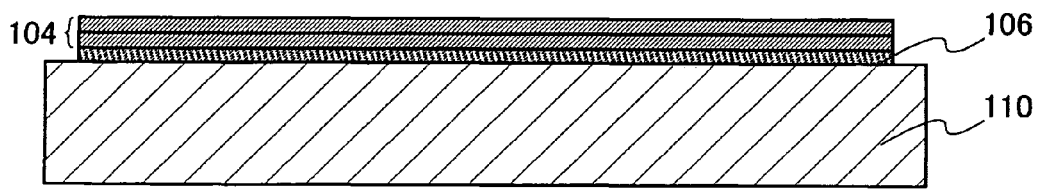

As set forth above, the single-crystal semiconductor layer 104 in which the properties of the first portion 104a such as crystallinity, an activation rate of impurities, and the like are almost the same to those of the second portion 104b can be manufactured (see FIG. 2C).

As to the single-crystal semiconductor layer 104 which is obtained through the above-described steps, planarization by chemical mechanical polishing (CMP) or etching is preferably performed. By improvement of the single-crystal semiconductor layer 104 in planarity, characteristic variations of a semiconductor element which will be subsequently formed can be suppressed. Note that a CMP step or an etching step may be omitted, if desired characteristics can be obtained. Alternatively, a CMP step or an etching step may be performed before the second laser light irradiation.

Alternatively, characteristics of the single-crystal semiconductor layer 104 may be improved by performing heating or laser light irradiation again. Note that a temperature at heat treatment can be set at around a heat-resistance temperature of the substrate 110 having an insulating surface. When a glass substrate is used as the substrate 110 having an insulating surface, the temperature at heat treatment may be set at around a strain point of the glass substrate. Specifically, heat treatment may be performed at a temperature approximately in a range from minus 50° C. to plus 50° C. of the strain point.

Next, the case in which the bonding layer 106 is provided on the side of the substrate 110 having an insulating surface is described with reference to FIGS. 3A to 3D. Note that steps up to laser light irradiation (first irradiation) are similar to those illustrated in FIGS. 1A and 1B; thus, the details are omitted.

Figure 3A:
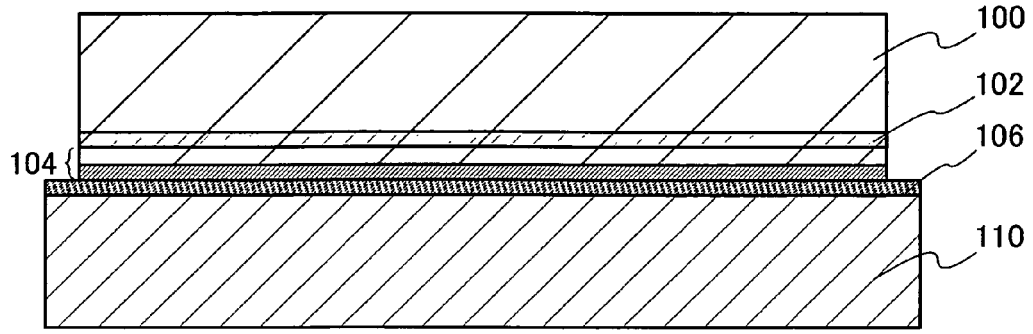
FIGS. 3A to 3D are cross-sectional views illustrating a manufacturing process of a semiconductor substrate of the present invention.

After the single-crystal semiconductor layer 104 is irradiated with laser light, the substrate 110 having an insulating surface, over which the bonding layer 106 is formed, is disposed in close contact with the single-crystal semiconductor substrate 100 (see FIG. 3A). Specifically, the bonding is performed by disposing the bonding layer 106 in close contact with the single-crystal semiconductor layer 104 which is irradiated with laser light. Note that a barrier layer may be provided between the bonding layer 106 and the substrate 110 having an insulating surface. When a barrier layer is provided, intrusion of impurities such as alkali metal or alkaline earth metal into the single-crystal semiconductor layer 104 can be prevented. A barrier layer is not necessarily provided in the case where intrusion of impurities into the single-crystal semiconductor layer 104 from the substrate 110 having an insulating surface can be neglected.

A barrier layer can be formed using one or a plurality of materials selected from silicon oxide, silicon nitride, silicon nitride oxide, silicon oxynitride, or the like. The barrier layer may have a single-layer structure or a stacked-layer structure. Note that a barrier layer is formed without limitation to the above-described materials, as long as intrusion of impurities can be prevented. Since a barrier layer is formed from an insulating material, the barrier layer can also be referred to as an insulating layer.

Note that a nitrogen-containing insulating layer may be provided between the single-crystal semiconductor layer 104 and the bonding layer 106. The nitrogen-containing insulating layer can be formed using one or a plurality of materials selected from silicon nitride, silicon nitride oxide, or silicon oxynitride. Note that the nitrogen-containing insulating layer may have a single-layer structure or a stacked-layer structure. For example, a silicon oxynitride film and a silicon nitride oxide film can be stacked from a side of the single-crystal semiconductor layer 104 to obtain the nitrogen-containing insulating layer. The nitrogen-containing insulating layer is provided to prevent intrusion of impurities such as movable ions like alkali metal or alkaline earth metal or water into the single-crystal semiconductor layer 104. Note that an insulating layer other than the nitrogen-containing insulating layer may be provided as long as intrusion of impurities can be prevented.

Note that in the case of providing the nitrogen-containing insulating layer, the nitrogen-containing insulating layer may be provided before or after ion irradiation which is performed on the single-crystal semiconductor substrate 100. When the nitrogen-containing insulating layer is provided before ion irradiation, increase in surface roughness of the single-crystal semiconductor substrate 100 due to ion irradiation can be prevented.

Figure 3B:
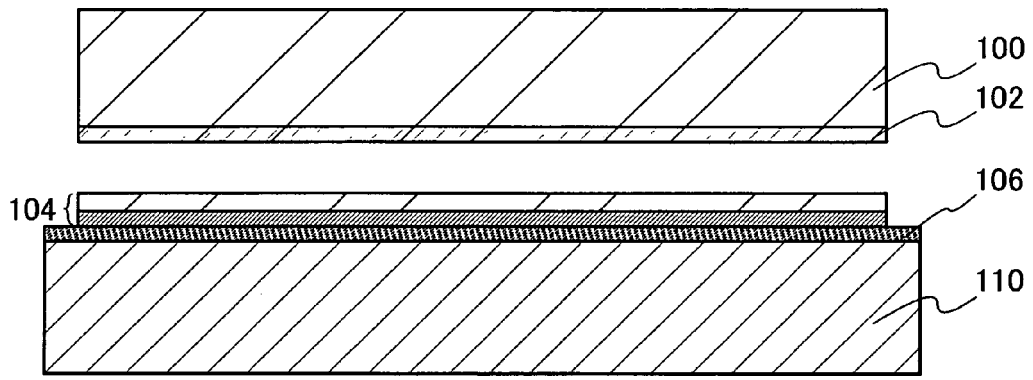

After that, the single-crystal semiconductor substrate 100 is separated (see FIG. 3B). Heat treatment at separation of the single-crystal semiconductor substrate 100 can be performed in a manner similar to that of the case in FIG. 2A; thus, the details are omitted.

Figure 3C:
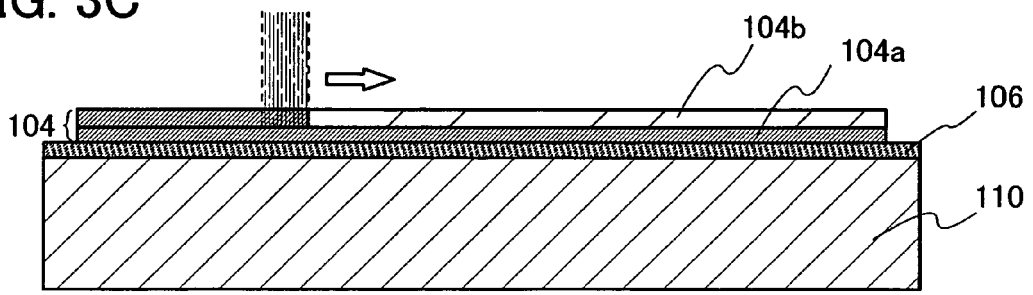

Next, the surface of the single-crystal semiconductor layer 104 is irradiated with laser light (see FIG. 3C). Accordingly, planarity of the single-crystal semiconductor layer 104 is improved; thus, crystallinity of the second portion 104b of the single-crystal semiconductor layer 104 can be recovered.

A laser which can be used for second laser light irradiation is similar to a laser which can be used for first laser light irradiation. In this embodiment mode, as an example, laser light irradiation using an excimer laser is to be performed. Specifically, a KrF excimer laser (wavelength: 248 nm), an XeCl excimer laser (wavelength: 308 nm), or the like is used.

Note that in the first laser light irradiation, temperature rise due to laser light irradiation must be suppressed to be less than a temperature at which separation in the damaged region occurs. On the other hand, in the second laser light irradiation, it is necessary to perform laser light irradiation at intensity at which the entire single-crystal semiconductor does not melt. Therefore, it is important to set intensity of laser light, as appropriate.

Figure 3D:
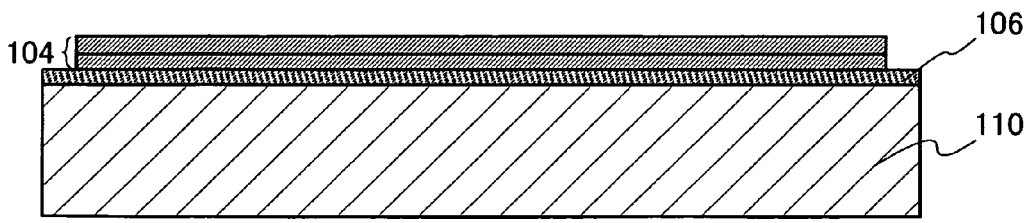

As set forth above, the single-crystal semiconductor layer 104 in which properties of the first portion 104a such as crystallinity, an activation rate of impurities and the like are almost the same to those of the second portion 104b can be manufactured (see FIG. 3D).

As to the single-crystal semiconductor layer 104 which is obtained through the above-described steps, planarization by chemical mechanical polishing (CMP) or etching is preferably performed. By improvement of the single-crystal semiconductor layer 104 in planarity, characteristic variations of a semiconductor element which will be subsequently formed can be suppressed. Note that a CMP step or an etching step may be omitted, if desired characteristics can be obtained. Alternatively, a CMP step or an etching step may be performed before the second laser light irradiation.

Alternatively, characteristics of the single-crystal semiconductor layer 104 may be improved by performing heating or laser light irradiation again. As to a temperature at heat treatment and a laser which can be used, it is possible to refer to the above descriptions; thus, the descriptions are omitted here.

As set forth above, a semiconductor substrate in which characteristics of the single-crystal semiconductor layer 104 are uniformed can be provided. Accordingly, a semiconductor device in which a semiconductor element has favorable characteristics can be provided.

Embodiment Mode 2

This embodiment mode will describe another example of a manufacturing method of a semiconductor substrate of the present invention with reference to FIGS. 4A to 4D, FIGS. 5A to 5C, FIGS. 6A to 6E, and FIGS. 7A to 7D. Specifically, laser light irradiation is performed after a single-crystal semiconductor layer is formed over a substrate having an insulating surface.

First, a single-crystal semiconductor substrate 400 is prepared. Then, the surface of the single-crystal semiconductor substrate 400 is irradiated with ions and the ions are introduced to a predetermined depth from the surface of the single-crystal semiconductor substrate 400 to form a damaged region 402 and a single-crystal semiconductor layer 404 (see FIG. 1A). As a method for forming the damaged region 402, an ion doping method, an ion implantation method, and the like can be given. Ion irradiation may be performed in consideration of the thickness of the single-crystal semiconductor layer 404 which is formed. The thickness of the single-crystal semiconductor layer 404 may be approximately 5 to 500 nm, and 10 to 200 nm is more preferable. An accelerating voltage at ion irradiation can be determined in consideration of the above-described thickness of the single-crystal semiconductor layer 404.

The single-crystal semiconductor substrate 400 is not particularly limited as long as it is a substrate made of a single-crystal semiconductor material, and a single-crystal silicon substrate can be used as an example. Alternatively, a substrate made of a compound semiconductor such as germanium, gallium arsenide, or indium phosphide can be applied. Hereinafter, the case in which a single-crystal silicon substrate is used as the single-crystal semiconductor substrate 400 is described.

As ions for irradiation, ions of hydrogen, helium, a halogen typified by fluorine, and the like can be given. When fluorine ion irradiation is performed as halogen ions, $BF_3$ may be used as a source gas. For example, when a single-crystal silicon substrate is used as the single-crystal semiconductor substrate 400 and the single-crystal semiconductor substrate 400 is irradiated with halogen ions like fluorine ions, fine voids are formed in the damaged region 402. This is because the halogen ion, with which the single-crystal semiconductor substrate 400 is irradiated, purges silicon atoms in a silicon crystal lattice. The single-crystal silicon substrate can be separated by changing the volumes of the fine voids. Specifically, the volume change of the fine voids is induced by low-temperature heat treatment. Note that hydrogen ion irradiation may be performed to add hydrogen into the voids after fluorine ion irradiation is performed.

Alternatively, the single-crystal semiconductor substrate 400 may be irradiated with a plurality of ions of the same atom, in which the mass numbers are different. For example, hydrogen ion irradiation can be performed by using $H^+$, $H_2^+$, and $H_3^+$ ions, and it is preferred that the proportion of $H_3^+$ ions is increased. Increase in the proportion of $H_3^+$ results in increase in the irradiation efficiency; thus, the irradiation time can be shortened. Note that heat treatment may be performed after the damaged region is formed.

Figure 4A:
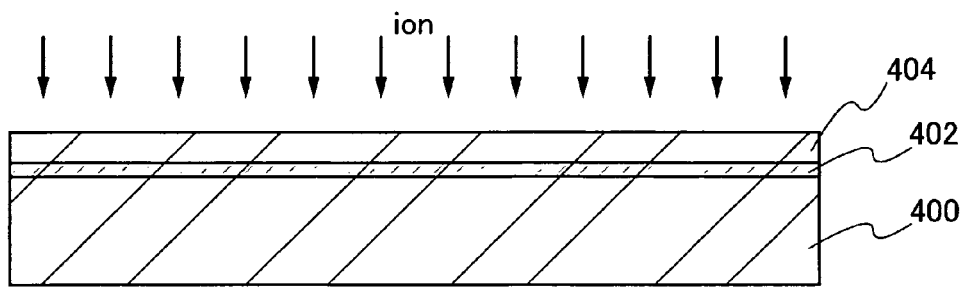
FIGS. 4A to 4D are cross-sectional views illustrating a manufacturing process of a semiconductor substrate of the present invention.
Figure 4B:
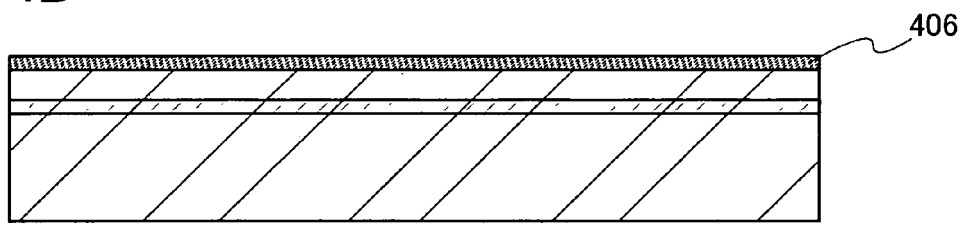

Next, a bonding layer 406 is formed over the single-crystal semiconductor layer 404 (see FIG. 4B). The bonding layer 406 may be formed of a silicon oxide film by a chemical vapor deposition method (CVD method), using an organic silane gas. Alternatively, a silicon oxide film which is formed by a chemical vapor deposition method, using a silane gas, can be applied. In the case of using a chemical vapor deposition method, it is necessary to perform deposition under a temperature condition in which degasification does not occur from the damaged region 402. Note that as to heat treatment for separating the single-crystal semiconductor layer 404 from the single-crystal semiconductor substrate 400, a temperature higher than a deposition temperature is applied. Further, since the bonding layer 406 is formed with an insulating material, the bonding layer 406 can also be referred to as an insulating layer.

The surface of the bonding layer 406 is formed smoothly and has a hydrophilicity. A silicon oxide film is appropriate as the bonding layer 406. In particular, a silicon oxide film which is formed by a chemical vapor deposition method, using an organic silane gas, is preferable. Examples of organic silane gas that can be used include silicon-containing compounds, such as tetraethoxysilane (TEOS) (chemical formula: $Si(OC_2H_5)_4$), trimethylsilane (TMS) (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

The above-described bonding layer 406 is provided with a thickness of approximately 5 to 500 nm. Accordingly, a surface of the single-crystal semiconductor layer 404 on which the bonding layer 406 is formed can be smoothed, which simultaneously contributes to the improvement of the smoothness of a surface of the bonding layer 406. Note that a substrate 410 having an insulating surface in a subsequent step can also be provided with a similar bonding layer. The single-crystal semiconductor substrate 400 and the substrate 410 having an insulating surface can be strongly bonded together by thus providing a silicon oxide film which is deposited with organic silane as a raw material for either one or both of bonding surfaces.

Note that a nitrogen-containing insulating layer may be provided between the single-crystal semiconductor layer 404 and the bonding layer 406. The nitrogen-containing insulating layer can be formed using one or a plurality of materials selected from silicon nitride, silicon nitride oxide, or silicon oxynitride. Note that the nitrogen-containing insulating layer may have a single-layer structure or a stacked-layer structure. For example, a silicon oxynitride film and a silicon nitride oxide film can be stacked from a side of the single-crystal semiconductor layer 404 to obtain the nitrogen-containing insulating layer. The nitrogen-containing insulating layer is provided to prevent intrusion of impurities such as movable ions like alkali metal or alkaline earth metal or water into the single-crystal semiconductor layer 404. Note that an insulating layer other than the nitrogen-containing insulating layer may be provided as long as intrusion of impurities can be prevented.

Note that in this embodiment mode, ion irradiation is performed and then the bonding layer 406 is provided; however, the present invention is not limited to this structure. As long as the strength of the bond can be kept above a certain value, a structure in which the bonding layer 406 is formed and then ion irradiation is performed may be employed. As to the case of providing the nitrogen-containing insulating layer, the nitrogen-containing insulating layer may be provided before or after ion irradiation, in a similar manner. When the nitrogen-containing insulating layer is provided before ion irradiation, increase in surface roughness of the single-crystal semiconductor substrate 400 due to ion irradiation can be prevented.

Figure 4C:
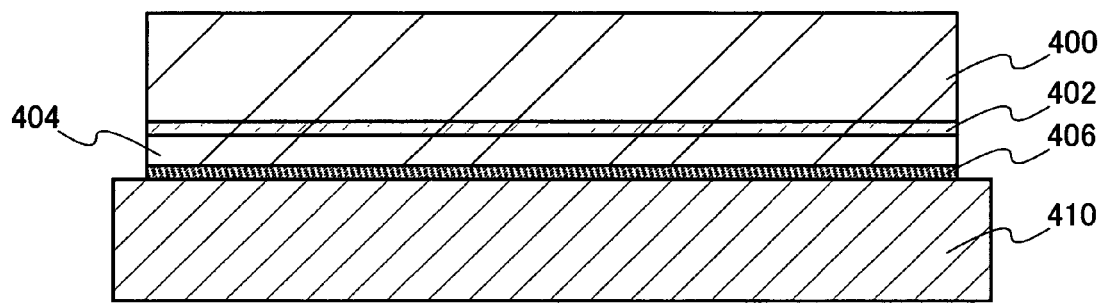

Next, the substrate 410 having an insulating surface and the bonding layer 406 are disposed in close contact with each other (see FIG. 4C). The substrate 410 having an insulating surface and the bonding layer 406 are disposed in close contact with each other and pressure is applied therebetween, so that the substrate and the bonding layer can be bonded firmly to each other by hydrogen bonds and covalent bonds. Note that it is preferable to perform heat treatment after the substrate 410 having an insulating surface and the single-crystal semiconductor substrate 400 are bonded to each other, with the bonding layer 406 interposed therebetween. The bonding strength can be further enhanced by performing heat treatment.

In order to form a strong bond, the surface which is bonded may be activated. For example, the surface which is subjected to the bonding is irradiated with an atomic beam or an ion beam. When an atomic beam or an ion beam is used, an inert gas atomic beam or inert gas ion beam of argon or the like can be used. Alternatively, plasma treatment or radical treatment is performed. Such surface treatment makes it possible to form a bond between different kinds of materials at a temperature of approximately from 200 to 400° C.

As the substrate 410 having an insulating surface, any of various glass substrates which are used in the electronics industry such as an aluminosilicate glass substrate, an aluminoborosilicate glass substrate, and a barium borosilicate glass substrate; a quartz substrate; a ceramic substrate; a sapphire substrate; or the like can be used. A glass substrate is preferably used, and a mother glass substrate having a large area can be used, such as a so-called sixth generation substrate (1500 mm×1850 mm), a so-called seventh generation substrate (1870 mm×2200 mm), and a so-called eighth generation substrate (2200 mm×2400 mm), for example. A mother glass substrate having a large area is used as the substrate 410 having an insulating surface, so that the area of the semiconductor substrate can be enlarged. Note that the substrate 410 having an insulating surface is not limited to the above-described substrates. For example, a substrate made from a resin material can also be used if its heat-resistance temperature is higher than a maximum temperature of the process. Further, in this embodiment mode, since laser light irradiation on the single-crystal semiconductor layer 404 is carried out through the substrate 410 having an insulating surface, the substrate 410 having an insulating surface must be formed from a material that transmits laser light.

Figure 4D:
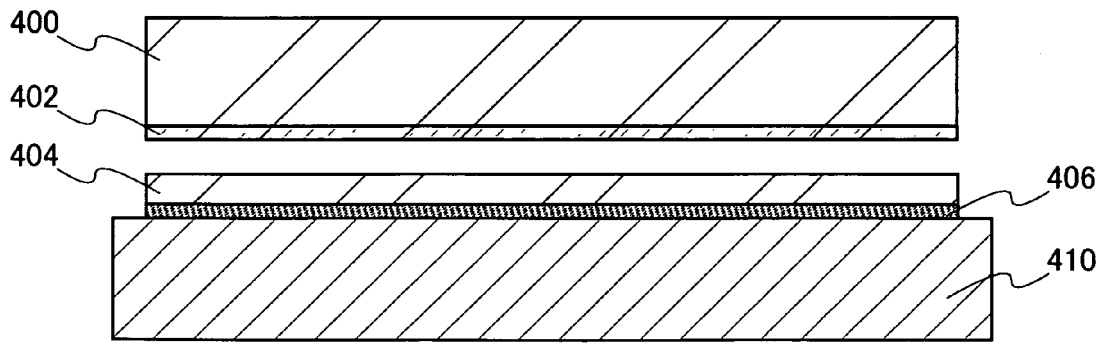

Next, heat treatment is performed to separate the single-crystal semiconductor layer 404 from the single-crystal semiconductor substrate 400 in the damaged region 402 (see FIG. 4D). For example, heat treatment is performed at 400 to 600° C., which induces the volume change of the fine voids formed the damaged region 402, resulting in the separation of the single-crystal semiconductor layer 404. Since the bonding layer 406 is bonded to the substrate 410 having an insulating surface, the single-crystal semiconductor layer 404 remains over the substrate 410 having an insulating surface.

When a glass substrate is used as the substrate 410 having an insulating surface, heat treatment may be performed approximately at a strain point of a glass substrate, specifically at a temperature in a range from minus 50° C. to plus 50° C. of the strain point. More specifically, heat treatment may be performed at a temperature greater than or equal to 580° C. and less than or equal to 680° C. Note that a glass substrate has a property of contraction by heat. Therefore, when a glass substrate is preheated approximately at a strain point, specifically at a temperature in a range from minus 50° C. to plus 50° C. of the strain point (or higher) in advance, contraction in subsequent heat treatment can be suppressed. Accordingly, even when heat treatment is performed on a glass substrate, to which a single-crystal semiconductor layer having a thermal expansion coefficient different from that of the glass substrate is bonded, separation of the single-crystal semiconductor layer from the glass substrate can be prevented. Further, transformation such as a warp of the glass substrate and the single-crystal semiconductor layer can be prevented. Note that the preheating treatment can be performed on any other substrates without limitation to a glass substrate, as long as a substrate having a property of contraction in heating is used.

Note that when a glass substrate is used, it is preferable to avoid rapid cooling at the termination of heating. Specifically, the glass substrate may be cooled down to a temperature less than or equal to a strain point at a speed of less than or equal to 2° C./min, preferably less than or equal to 0.5° C./min, more preferably less than or equal to 0.3° C./min. Reduction in the cooling rate can reduce local stress which is generated in the contraction of the glass substrate. The heat treatment may be performed under atmospheric pressure or under reduced pressure. As to an atmosphere, a nitrogen atmosphere, an oxygen atmosphere, or the like can be set, as appropriate.

Note that heat treatment related to the bonding step and heat treatment related to the separation step can be performed simultaneously. In this case, two steps can be performed simultaneously in a single heat treatment; therefore, a semiconductor substrate can be manufactured at low cost.

Figure 5A:
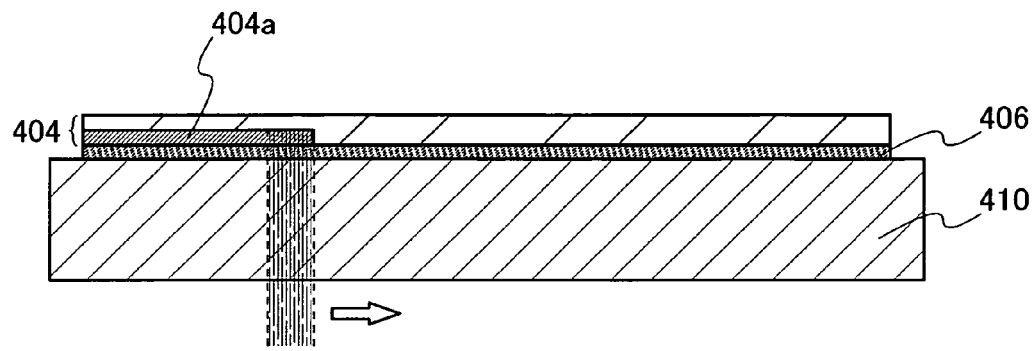
FIGS. 5A to 5C are cross-sectional views illustrating a manufacturing process of a semiconductor substrate of the present invention.

Next, laser light irradiation is performed from the back surface of the single-crystal semiconductor layer 404 (see FIG. 5A). Accordingly, a first portion 404a where the crystallinity is recovered can be formed.

As to the laser light irradiation, a continuous-wave laser (a CW laser), a pseudo-CW laser (a pulsed laser, the repetition rate of which is greater than or equal to 10 MHz, preferably greater than or equal to 80 MHz), or the like can be used, for example. Specifically, as the CW laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a helium cadmium laser, or the like can be used. As the pseudo-CW laser, a pulsed laser such as an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a copper vapor laser, or a gold vapor laser can be used. Such a pulsed laser can be treated in the same manner as that of a CW laser, as the repetition rate is increased.

Note that in this embodiment mode, as an example, laser light irradiation using an excimer laser is performed. Specifically, a KrF excimer laser (wavelength: 248 nm), a XeCl excimer laser (wavelength: 308 nm), or the like is used.

Figure 5B:
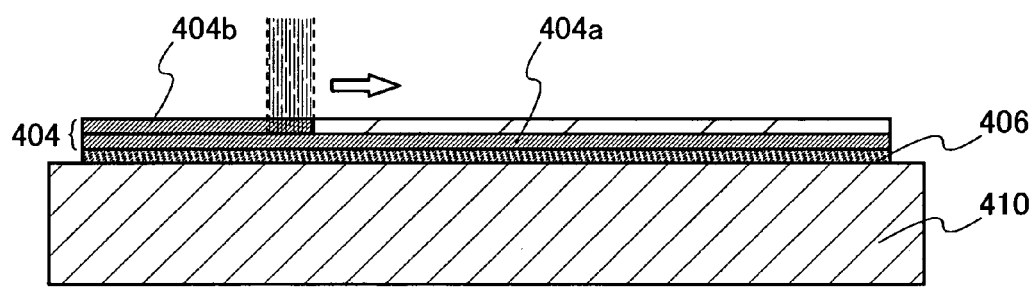

Next, laser light irradiation is performed from the front surface of the single-crystal semiconductor layer 404 (see FIG. 5B). Accordingly, planarity of the single-crystal semiconductor layer 404 is improved; thus, crystallinity of a second portion 404b of the single-crystal semiconductor layer 404 can be recovered. Note that a laser which can be used for the second laser light irradiation is similar to a laser which can be used for the first laser light irradiation.

Figure 5C:
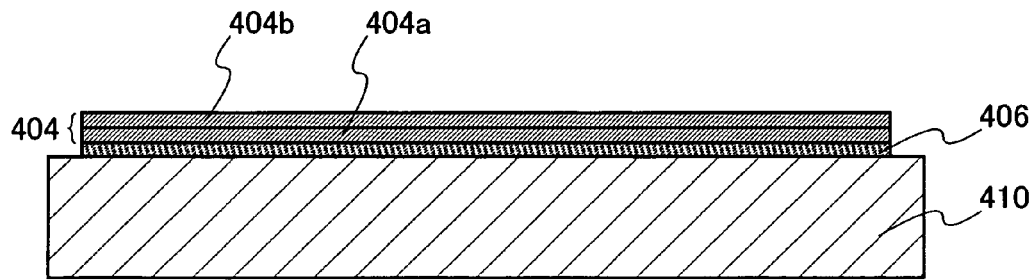

As set forth above, the single-crystal semiconductor layer 404 in which properties of the first portion 404a such as crystallinity, an activation rate of impurities, and the like are almost the same to those of the second portion 404b can be manufactured (see FIG. 5C).

As to the single-crystal semiconductor layer 404 which is obtained through the above-described steps, planarization by chemical mechanical polishing (CMP) or etching is preferably performed. By improvement of the single-crystal semiconductor layer 404 in planarity, characteristic variations of a semiconductor element which will be subsequently formed can be suppressed. Note that a CMP step or an etching step may be omitted, if desired characteristics can be obtained. Alternatively, a CMP step or an etching step may be performed before the first laser light irradiation or the second laser light irradiation.

Alternatively, characteristics of the single-crystal semiconductor layer 404 may be improved by performing heating or laser light irradiation again. Note that a temperature at heat treatment can be set at around the heat-resistance temperature of the substrate 410 having an insulating surface. When a glass substrate is used as the substrate 410 having an insulating surface, the temperature at heat treatment may be set at around a strain point of the glass substrate. Specifically, heat treatment may be performed at a temperature approximately in a range from minus 50° C. to plus 50° C. of the strain point.

Note that in this embodiment mode, laser light irradiation is first performed from the back surface side (the side of the substrate having an insulating surface) and then another laser light irradiation is performed from the front surface side; however, the present invention is not limited thereto. Alternatively, laser light irradiation may be first performed from the front surface side and then another laser light irradiation may be performed from the back surface side. Further alternatively, laser light irradiation from the back surface may be performed before separation of the single-crystal semiconductor layer 404, and another laser light irradiation may be performed from the front surface (front surface irradiation) after separation of the single-crystal semiconductor layer 404. In this case, heat generated in the back-surface irradiation can be used for separation of the single-crystal semiconductor layer 404, so that the laser light irradiation step and the separation step can be performed simultaneously. In this case, it is preferable to increase intensity of the laser light of the back-surface irradiation with respect to the laser light of the front-surface irradiation.

Next, the case of providing the bonding layer 406 on the side of the substrate 410 having an insulating surface is described with reference to FIGS. 6A to 6E. First, a single-crystal semiconductor substrate 400 is prepared. Then, the surface of the single-crystal semiconductor substrate 400 is irradiated with ions and the ions are introduced to a predetermined depth from the surface of the single-crystal semiconductor substrate 400 to form a damaged region 402 and a single-crystal semiconductor layer 404 (see FIG. 6A). The details are similar to the case of providing the bonding layer 406 on the side of the single-crystal semiconductor substrate 400; thus, the descriptions are omitted here.

Figure 6A:
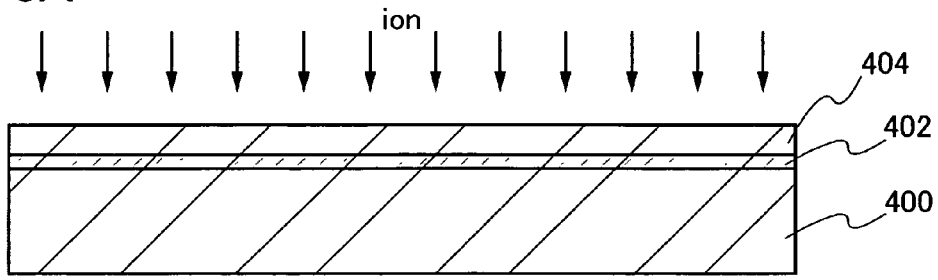
FIGS. 6A to 6E are cross-sectional views illustrating a manufacturing process of a semiconductor substrate of the present invention.
Figure 6B:
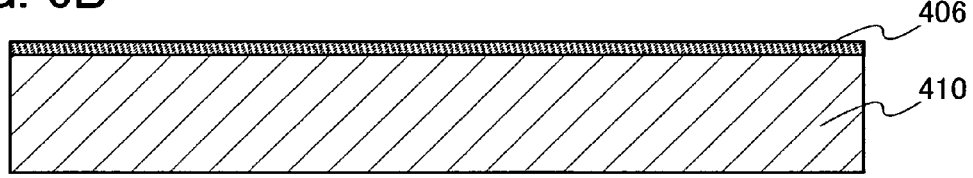

Next, a bonding layer 406 is formed over a substrate 410 having an insulating surface (see FIG. 6B). The bonding layer 406 may be formed of a silicon oxide film by a chemical vapor deposition method (CVD method), using an organic silane gas. Since the bonding layer 406 is formed with an insulating material, the bonding layer 406 can also be referred to as an insulating layer. Note that a barrier layer may be provided between the bonding layer 406 and the substrate 410 having an insulating surface. When the barrier layer is provided, intrusion of impurities such as alkali metal or alkaline earth metal into the single-crystal semiconductor layer 404 can be prevented. The barrier layer is not necessarily provided in the case where intrusion of impurities into the single-crystal semiconductor layer 404 from the substrate 410 having an insulating surface can be neglected. Details can be referred to the descriptions shown in Embodiment Mode 1.

Figure 6C:
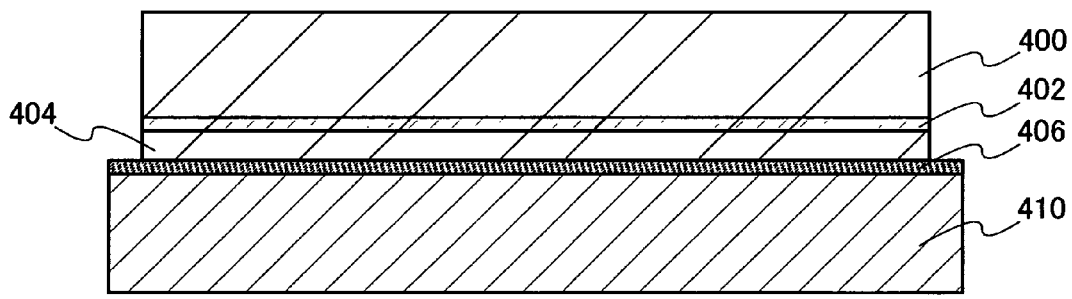

Next, the single-crystal semiconductor layer 404 and the bonding layer 406 are disposed in close contact with each other (see FIG. 6C). The single-crystal semiconductor layer 404 and the bonding layer 406 are disposed in close contact with each other and pressure is applied therebetween, so that the single-semiconductor layer and the bonding layer are bonded firmly to each other by hydrogen bonds and covalent bonds. Note that it is preferable to perform heat treatment after the substrate 410 having an insulating surface and the single-crystal semiconductor substrate 400 are bonded to each other, with the bonding layer 406 interposed therebetween. The bonding strength can be further enhanced by performing heat treatment.

Note that a nitrogen-containing insulating layer may be provided between the single-crystal semiconductor layer 404 and the bonding layer 406. The nitrogen-containing insulating layer can be formed using one or a plurality of materials selected from silicon nitride, silicon nitride oxide, or silicon oxynitride. Note that the nitrogen-containing insulating layer may have a single-layer structure or a stacked-layer structure. For example, a silicon oxynitride film and a silicon nitride oxide film can be stacked from a side of the single-crystal semiconductor layer 404 to obtain the nitrogen-containing insulating layer. The nitrogen-containing insulating layer is provided to prevent intrusion of impurities such as movable ions like alkali metal or alkaline earth metal or water into the single-crystal semiconductor layer 404. Note that an insulating layer other than the nitrogen-containing insulating layer may be provided as long as intrusion of impurities can be prevented.

Note that in the case of providing the nitrogen-containing insulating layer, the nitrogen-containing insulating layer may be provided before or after ion irradiation which is performed on the single-crystal semiconductor substrate 400. When the nitrogen-containing insulating layer is provided before ion irradiation, increase in surface roughness of the single-crystal semiconductor substrate 400 due to ion irradiation can be prevented.

Figure 6D:
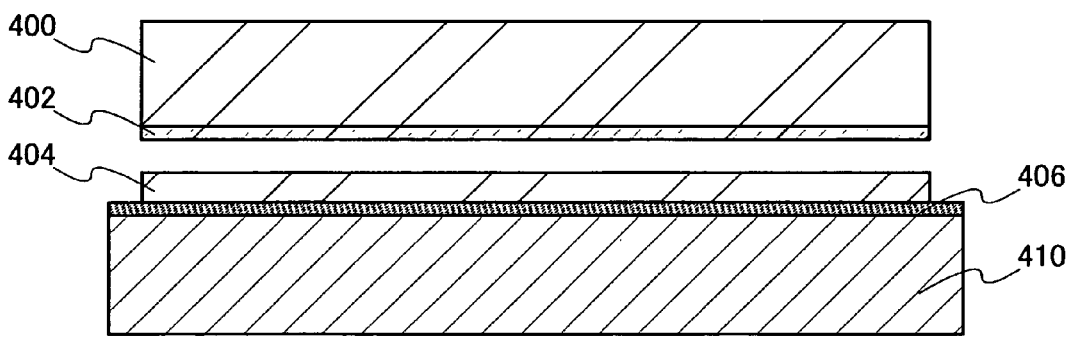
Figure 6E:
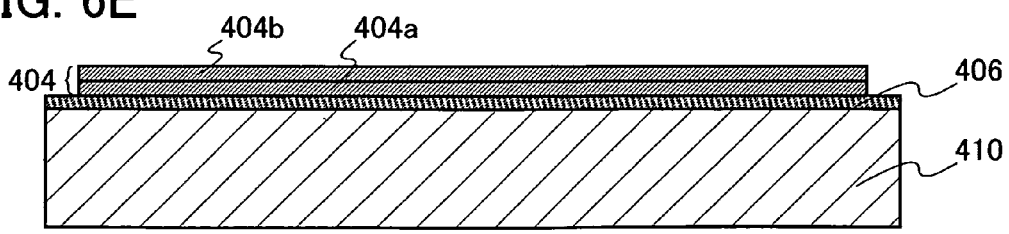

Next, the single-crystal semiconductor substrate 400 is separated (see FIG. 6D). As to the details at separation of the single-crystal semiconductor substrate 400, it is possible to refer to the descriptions in Embodiment Mode 1 and the like.

After that, in a manner similar to that of the case in FIGS. 5A to 5C, laser light irradiation is performed from the back surface and the front surface of the single-crystal semiconductor layer 404. As set forth above, the single-crystal semiconductor layer 404 in which properties of a first portion 404a such as crystallinity, an activation rate of impurities, and the like are almost the same to those of a second portion 404b can be formed (see FIG. 6E).

As to the single-crystal semiconductor layer 404 which is obtained through the above-described steps, planarization by chemical mechanical polishing (CMP) or etching is preferably performed, too. By improvement of the single-crystal semiconductor layer 404 in planarity, characteristic variations of a semiconductor element which will be subsequently formed can be suppressed. Note that a CMP step or an etching step may be omitted, if desired characteristics can be obtained. Alternatively, a CMP step or an etching step may be performed before second laser light irradiation.

Alternatively, characteristics of the single-crystal semiconductor layer 404 may be improved by performing heating or laser light irradiation again. As to a temperature at heat treatment and a laser which can be used, it is possible to refer to the above descriptions; thus, the descriptions are omitted here.

As set forth above, a semiconductor substrate in which the single-crystal semiconductor layer 404 has uniform characteristics can be provided. Accordingly, a semiconductor device in which a semiconductor element has favorable characteristics can be provided.

Note that, this embodiment mode can be implemented by being combined with Embodiment Mode 1, as appropriate.

Embodiment Mode 3

This embodiment mode will describe an example of a manufacturing method of a semiconductor device of the present invention with reference to FIGS. 7A to 7D, FIGS. 8A to 8C, FIGS. 9A to 9C, and FIGS. 10A and 10B. Note that a liquid crystal display device is given as an example of a semiconductor device in this embodiment mode; however, a semiconductor device of the present invention is not limited to a liquid crystal display device.

Figure 7A:
FIGS. 7A to 7D are cross-sectional views illustrating a manufacturing process of a semiconductor device of the present invention.

First, a single-crystal semiconductor layer is formed over a substrate having an insulating surface by the method shown in Embodiment Mode 1 or 2 (see FIG. 7A). Here a structure in which a barrier layer 702, a bonding layer 704, and a single-crystal semiconductor layer 706 are sequentially provided over a substrate 700 having an insulating surface is described; however, the present invention is not limited thereto. Next, the single-crystal semiconductor layer 706 and the bonding layer 704 are patterned into a desired shape to form island-shaped single-crystal semiconductor layers.

As to an etching process in the patterning, either plasma etching (dry etching) or wet etching may be employed. In a case of processing a large-sized substrate, plasma etching is suitable. As to an etching gas, a fluorine-based or chlorine-based gas such as $CF_4$, $NF_3$, $Cl_2$, or $BCl_3$ is used, and an inert gas such as He or Ar may be added, as appropriate. In addition, when an etching process using an electric discharge at atmospheric pressure is applied, electric discharge can be locally performed, and it is not necessary to form a mask layer over an entire surface of the substrate.

After the single-crystal semiconductor layer 706 and the bonding layer 704 are patterned, a p-type impurity such as boron, aluminum, or gallium may be added in order to control a threshold voltage. For example, as a p-type impurity, boron can be added at a concentration of greater than or equal to $5\times10^{17}$ $cm^{-3}$ and less than or equal to $1\times10^{18}$ $cm^{-3}$.

As the barrier layer 702, a silicon nitride layer and a silicon oxide layer are formed in a stacked-layer structure over the substrate 700 having an insulating surface. The barrier layer 702 is provided, so that contamination of the single-crystal semiconductor layer 706 with movable ions can be prevented. Note that a silicon nitride oxide layer, an aluminum nitride layer, or an aluminum nitride oxide layer may be applied as an alternative to the silicon nitride layer.

Figure 7B:
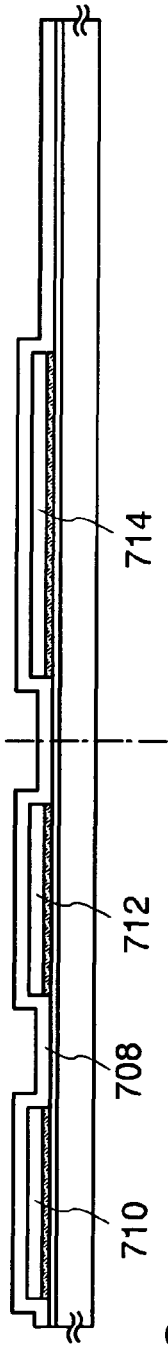
Figure 7C:
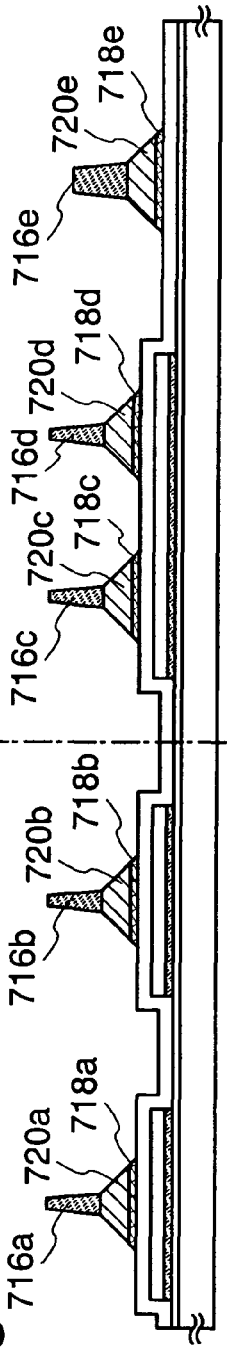

Next, a gate insulating layer 708 which covers the island-shaped single-crystal semiconductor layers is formed (see FIG. 7B). Note that for convenience, the island-shaped single-crystal semiconductor layers which are formed by patterning are each referred to as single-crystal semiconductor layers 710, 712, and 714. The gate insulating layer 708 is formed of a silicon-containing insulating film by a plasma CVD method, a sputtering method, or the like, to have a thickness of approximately greater than or equal to 10 nm and less than or equal to 150 nm. Specifically, the gate insulating layer 708 may be formed from an oxide material or a nitride material of silicon typified by silicon nitride, silicon oxide, silicon oxynitride, and silicon nitride oxide, or the like. Note that the gate insulating layer 708 may have a single-layer structure or a stacked-layer structure. Further, a thin silicon oxide film having a thickness of approximately greater than or equal to 1 nm and less than or equal to 100 nm, preferably greater than or equal to 1 nm and less than or equal to 10 nm, and more preferably greater than or equal to 2 nm and less than or equal to 5 nm, may be formed between the single-crystal semiconductor layers and the gate insulating layer. Note that a rare gas element such as argon may be contained in a reactive gas in order to form a gate insulating layer with little leak current at a low temperature.

Next, a first conductive film and a second conductive film which are used as a gate electrode layer are stacked over the gate insulating layer 708. The thickness of the first conductive film may be approximately greater than or equal to 20 nm and less than or equal to 100 nm, and the thickness of the second conductive film may be approximately greater than or equal to 100 nm and less than or equal to 400 nm. The first conductive film and the second conductive film can be formed by a sputtering method, an evaporation method, a CVD method, or the like. The first conductive film and the second conductive film may be formed of an element selected from tantalum (Ta), tungsten (W), titanium (Ti), molybdenum (Mo), aluminum (Al), copper (Cu), chromium (Cr), or neodymium (Nd), an alloy material or a compound including any of those elements as a main component, or the like. A semiconductor film typified by a polycrystalline silicon film that is doped with an impurity element such as phosphorus, an AgPdCu alloy, or the like may also be used as the first conductive film and the second conductive film. Note that the two-layer structure is described in this embodiment mode; however, the present invention is not limited thereto. Alternatively, a three-layer structure or a single-layer structure may be employed.

Then, a photolithography method is used to form masks 716a, 716b, 716c, 716d, and 716e each formed of a resist material. Then, the first conductive film and the second conductive film are processed into a desired shape with the use of the masks to form first gate electrode layers 718a, 718b, 718c, and 718d, a first conductive layer 718e, and conductive layers 720a, 720b, 720c, 720d, and 720e (see FIG. 7C).

By using an inductively coupled plasma (ICP) etching method and adjusting etching conditions (the amount of electric power applied to a coil-shaped electrode layer, the amount of electric power applied to an electrode layer on the side of a substrate, an electrode temperature on the side of a substrate, and the like) as appropriate, etching can be performed so as to obtain a desired taper shape. Alternatively, the taper angle and the like can be controlled by the shape of the mask. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used, as appropriate. In this embodiment mode, the second conductive film is etched using an etching gas containing $CF_4$, $Cl_2$, and $O_2$, and the first conductive film is successively etched using an etching gas containing $CF_4$ and $Cl_2$.

Next, the conductive layers 720a, 720b, 720c, 720d and 720e are processed into a desired shape, using the masks 716a, 716b, 716c, 716d, and 716e. At this time, etching is performed under an etching condition in which the selectivity of the second conductive film, which forms the conductive layers, to the first conductive film, which forms the first gate electrode layers and the first conductive layer, is high. By this etching, second gate electrode layers 722a, 722b, 722c, and 722d, and a second conductive layer 722e are formed. In this embodiment mode, the second gate electrode layers and the second conductive layer also have a taper shape, and the respective taper angles are larger than the taper angles of the first gate electrode layers 718a, 718b, 718c, and 718d and the first conductive layer 718e. Note that in this specification, a taper angle is an angle between a bottom surface and a side surface of an object. Thus, when each taper angle is 90 degrees, the conductive layers each have a side surface perpendicular to the bottom surface. When each taper angle has a degree of less than 90 degrees, coverage of stacked films is improved; thus, defects can be reduced. Note that in this embodiment mode, $Cl_2$, $SF_6$, and $O_2$ are used as an etching gas for forming the second gate electrode layers and the second conductive layer.

Figure 7D:
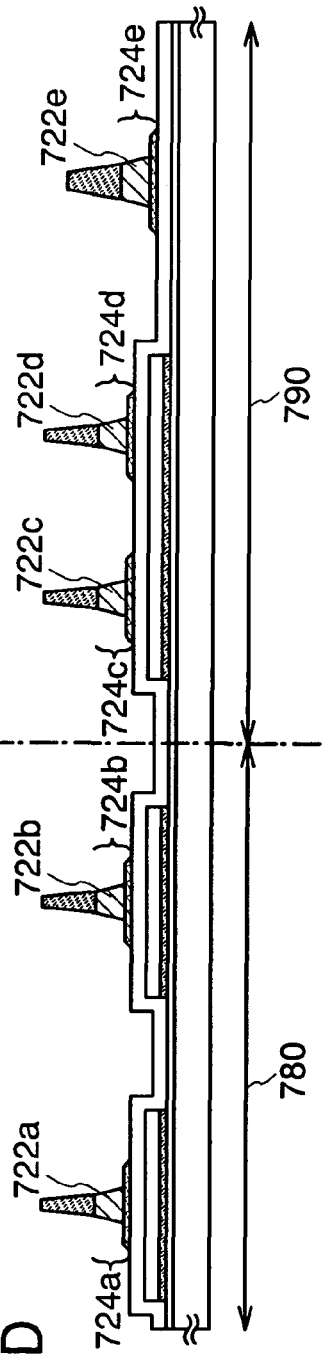

Through the above steps, gate electrode layers 724a and 724b can be formed in a peripheral driver circuit region 780, and gate electrode layers 724c and 724d and a conductive layer 724e can be formed in a pixel region 790 (see FIG. 7D). Note that the masks 716a, 716b, 716c, 716d, and 716e are removed after the above-described step.

Next, an impurity element imparting n-type conductivity is added using the gate electrode layers 724a, 724b, 724c, and 724d as masks to form first n-type impurity regions 726a, 726b, 728a, 728b, 730a, 730b, and 730c (see FIG. 8A). In this embodiment mode, doping is performed using phosphine ($PH_3$) as a doping gas containing an impurity element. Here, phosphorus (P) which is an impurity element imparting n-type conductivity is added in the first n-type impurity regions at a concentration of approximately $1 \times 10^{17}$ to $5 \times 10^{18}/cm^3$.

Next, a mask 732a, a mask 732b, and a mask 732c are formed to cover the single-crystal semiconductor layer 710 and part of the single-crystal semiconductor layer 714. An impurity element imparting n-type conductivity is added using the masks 732a, 732b, and 732c, and the second gate electrode layer 722b as masks. Accordingly, second n-type impurity regions 734a and 734b; third n-type impurity regions 736a and 736b; second n-type impurity regions 740a, 740b, and 740c; and third n-type impurity regions 742a, 742b, 742c, and 742d are formed. In this embodiment mode, doping is performed using phosphine ($PH_3$) as a doping gas containing an impurity element. Here, phosphorus (P) which is an impurity element imparting n-type conductivity is added to the second n-type impurity regions at a concentration of approximately $5 \times 10^{19}$ to $5 \times 10^{20}/cm^3$. The third n-type impurity regions 736a and 736b are formed to contain the impurity element imparting n-type conductivity at the same concentration as or at a slightly higher concentration than the third n-type impurity regions 742a, 742b, 742c, and 742d. In addition, channel formation regions 738, 744a, and 744b are formed (see FIG. 8B).

Each of the second n-type impurity regions is a high-concentration impurity region and functions as a source or a drain. On the other hand, each of the third n-type impurity regions is a low-concentration impurity region and functions as a so-called LDD (Lightly Doped Drain) region. Each of the third n-type impurity regions 736a and 736b is formed in a region overlapped with the first gate electrode layer 718b. Accordingly, an electric field in the vicinity of a source or a drain can be relieved, and deterioration of on-state current due to hot carriers can be prevented. On the other hand, each of the third n-type impurity regions 742a, 742b, 742c, and 742d is not overlapped with the gate electrode layer 724c or 724d; thus, an effect of reducing off-state current can be obtained.

Next, the masks 732a, 732b, and 732c are removed, and masks 746a and 746b which respectively cover the single-crystal semiconductor layers 712 and 714 are formed. An impurity element imparting p-type conductivity is added using the masks 746a and 746b and the gate electrode layer 724a as masks. Accordingly, first p-type impurity regions 748a and 748b, and second p-type impurity regions 750a and 750b are formed. In this embodiment mode, doping is performed using diborane ($B_2H_6$) as a doping gas containing an impurity element. Here, boron (B) which is an impurity element imparting p-type conductivity is added in the first p-type impurity regions and the second p-type impurity regions at a concentration of approximately $1\times10^{20}$ to $5\times10^{21}/cm^3$. In addition, a channel formation region 752 is formed (see FIG. 8C).

Each of the first p-type impurity regions is a high-concentration impurity region and functions as a source or a drain. On the other hand, each of the second p-type impurity regions is a low-concentration impurity region and functions as a so-called LDD (Lightly Doped Drain) region.

After that, the masks 746a and 746b are removed. After the masks are removed, an insulating film may be formed so as to cover the side surfaces of the gate electrode layers. The insulating film can be formed by a plasma CVD method or a low-pressure CVD (LPCVD) method. Alternatively, heat treatment, intense light irradiation, laser light irradiation, or the like may be performed in order to activate the impurity elements.

Next, an interlayer insulating layer which covers the gate electrode layers and the gate insulating layer is formed. In this embodiment mode, the interlayer insulating layer is formed to have a stacked-layer structure of insulating films 754 and 756 (see FIG. 9A). The stacked-layer structure is formed by forming a silicon nitride oxide film with a thickness of 100 nm as the insulating film 754 and forming a silicon oxynitride film with a thickness of 900 nm as the insulating film 756. Although the two-layer structure is employed in this embodiment mode, a single-layer structure or a stacked-layer structure of three or more layers may be employed. In this embodiment mode, the insulating film 754 and the insulating film 756 are continuously formed using a plasma CVD method. Note that the insulating films 754 and 756 are not limited to the above-described material.

The insulating films 754 and 756 can alternatively be formed from a material selected from silicon oxide, silicon nitride, aluminum oxide, aluminum nitride (AlN), aluminum oxynitride (AlON), aluminum nitride oxide containing more nitrogen than oxygen (AlNO), diamond-like carbon (DLC), a nitrogen-containing carbon film, or another substance containing an inorganic insulating material. Alternatively, a siloxane resin may be used. Note that a siloxane resin is a resin including a Si—O—Si bond. Siloxane has a skeletal structure formed of a bond of silicon (Si) and oxygen (O) and has an organic group containing at least hydrogen (e.g., an alkyl group or an aryl group) or a fluoro group as a substituent. Siloxane may have both an organic group containing at least hydrogen and a fluoro group as a substituent. Alternatively, an organic insulating material such as polyimide, acrylic polymer, polyamide, polyimide amide, benzocyclobutene-based material, or polysilazane can be used.

Next, contact holes (openings) which reach the single-crystal semiconductor layers and the gate electrode layers are formed in the insulating films 754 and 756 and the gate insulating layer 708, using a mask formed of a resist material. Etching may be performed once or plural times depending on the selectivity of a material to be used. In this embodiment mode, first etching is performed under a condition in which high etching selectivity can be obtained between the insulating film 756 which is a silicon oxynitride film, and the insulating film 754 which is a silicon nitride oxide film and the gate insulating layer 708. Accordingly, the insulating film 756 is removed. Next, the insulating film 754 and the gate insulating layer 708 are removed by second etching, and openings which each reach a source or a drain are formed.

Then, a conductive film is formed so as to cover the openings, and the conductive film is etched. Accordingly, source or drain electrode layers 758a, 758b, 760a, 760b, 762a, and 762b which are electrically connected to part of each source or drain region are formed. The source or drain electrode layers can be formed using one or a plurality of elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), nickel (Ni), zinc (Zn), niobium (Nb), silicon (Si), phosphorus (P), boron (B), arsenic (As), gallium (Ga), indium (In), or tin (Sn); a compound or an alloy material containing any of the above elements as its component (for example, indium tin oxide (ITO), indium zinc oxide (IZO), indium tin oxide added with silicon oxide (ITSO), zinc oxide (ZnO), aluminum-neodymium (Al—Nd), magnesium-silver (MgAg), or the like); a material that is a combination of any of these compounds; or the like. Alternatively, a silicide (for example, aluminum-silicon, molybdenum-silicon, or nickel silicide), a nitrogen-containing compound (for example, titanium nitride, tantalum nitride, or molybdenum nitride), silicon (Si) that is doped with an impurity element such as phosphorus (P), or the like can be used.

Figure 9A:
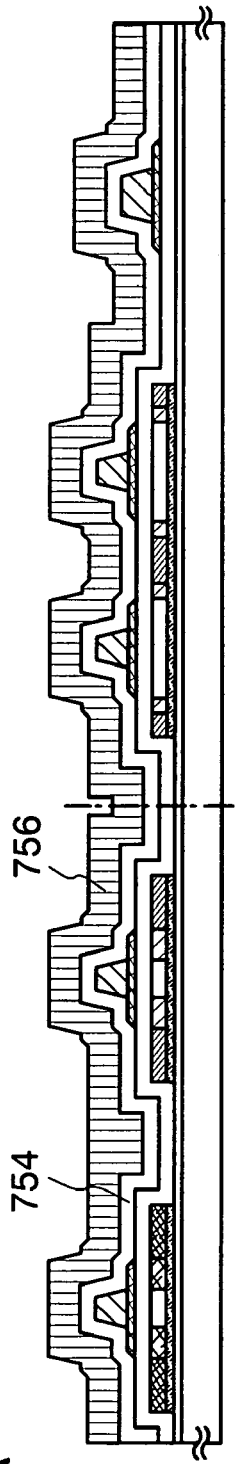
FIGS. 9A to 9C are cross-sectional views illustrating a manufacturing process of a semiconductor device of the present invention.
Figure 9B:
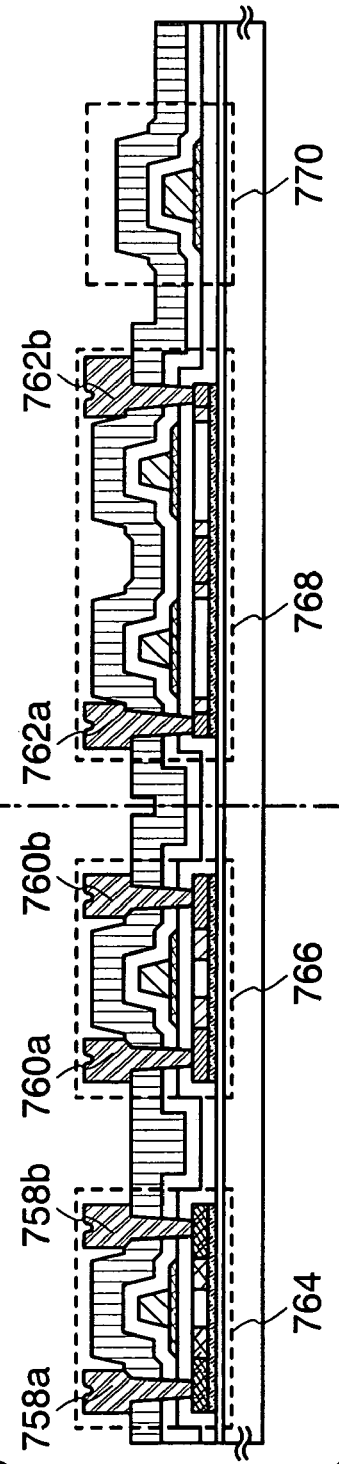

Through the above steps, a p-channel thin film transistor 764 and an n-channel thin film transistor 766 are formed in the peripheral driver circuit region 780, and an n-channel thin film transistor 768 and a capacitor wiring 770 are formed in the pixel region 790 (see FIG. 9B).

Then, an insulating film 772 is formed as a second interlayer insulating layer. The insulating film 772 can be formed of a material selected from silicon oxide, silicon nitride, silicon oxynitride, silicon nitride oxide, aluminum oxide, aluminum nitride (AlN), aluminum oxynitride (AlON), aluminum nitride oxide containing more nitrogen than oxygen, diamond-like carbon (DLC), a nitrogen-containing carbon film, phosphosilicate glass (PSG), borophosphosilicate glass (BPSG), an alumina film, polysilazane, or another substance containing an inorganic insulating material. Alternatively, a siloxane resin may be used. Further alternatively, an organic insulating material such as polyimide, acrylic polymer, polyamide, polyimide amide, or benzocyclobutene-based material can be used.

In this embodiment mode, the second interlayer insulating layer is provided for planarization. The insulating layer provided for planarization is required to have a high heat resistant property, a high insulating property, and a high ability to planarize steps. Therefore, the second interlayer insulating layer is preferably formed by a coating method typified by a spin coating method.

Figure 9C:
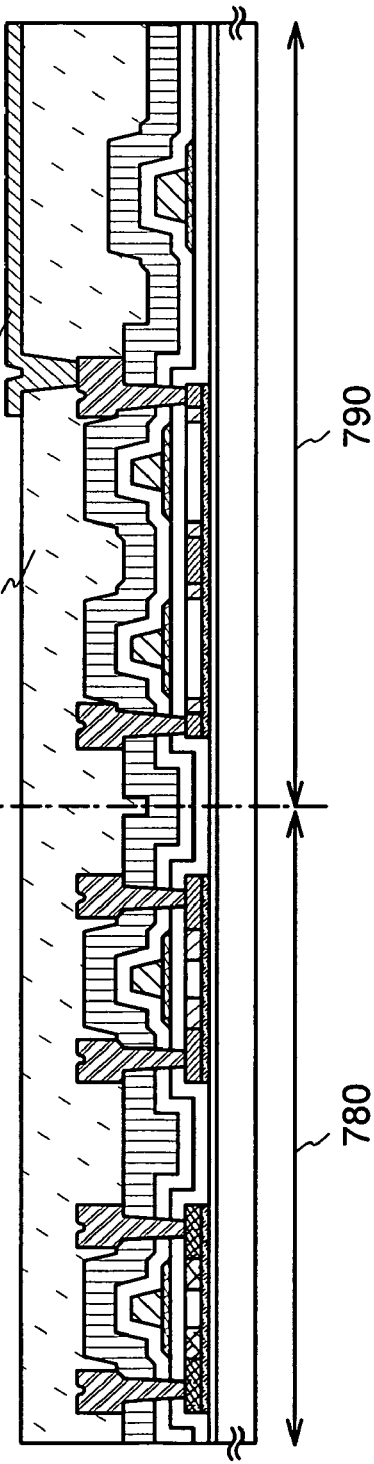

Next, a contact hole is formed in the insulating film 772 of the pixel region 790 to form a pixel electrode layer 774 (see FIG. 9C). The pixel electrode layer 774 can be formed using indium tin oxide (ITO), indium zinc oxide (IZO) in which zinc oxide (ZnO) is mixed with indium oxide, a conductive material in which silicon oxide ($SiO_2$) is mixed with indium oxide, organic indium, organic tin, indium oxide containing tungsten oxide, indium zinc oxide containing tungsten oxide, indium oxide containing titanium oxide, indium tin oxide containing titanium oxide, a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), an alloy thereof, or metal nitride thereof.

A conductive composition containing a conductive macromolecule (also referred to as a conductive polymer) can also be used as the pixel electrode layer 774. A thin film of a conductive composition preferably has a sheet resistance of less than or equal to 10000 $\Omega$/square. When a thin film of a conductive composition is formed as a pixel electrode layer having a light-transmitting property, light transmittance is preferably greater than or equal to 70% at a wavelength of 550 nm. Further, the resistivity of a conductive macromolecule which is contained in the thin film of a conductive composition is preferably less than or equal to 0.1 $\Omega\cdot$cm.

As the above-described conductive macromolecule, a so-called $\pi$ electron conjugated conductive macromolecule can be used. For example, polyaniline and a derivative thereof, polypyrrole and a derivative thereof, polythiophene and a derivative thereof, and a copolymer of those materials can be given.

Specific examples of a conjugated conductive macromolecule are given below: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), poly(N-methylpyrrole), polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

Any of the above-described conductive macromolecules may be used alone. Alternatively, any of the above-described conductive macromolecules can be used with an organic resin added thereto to adjust film characteristics.

As to an organic resin, as long as a resin is compatible to a conductive macromolecule or a resin can be mixed and dispersed into a conductive macromolecule, a thermosetting resin, a thermoplastic resin, or a photocurable resin may be used. For example, a polyester-based resin such as poly(ethylene terephthalate), poly(butylene terephthalate), or poly(ethylene naphthalate); a polyimide-based resin such as polyimide or polyimide amide; a polyamide resin such as polyamide 6, polyamide 66, polyamide 12, or polyamide 11; a fluorine resin such as poly(vinylidene fluoride), poly(vinyl fluoride), polytetrafluoroethylene, ethylene-tetrafluoroethylene copolymer, or polychlorotrifluoroethylene; a vinyl resin such as poly(vinyl alcohol), poly(vinyl ether), poly(vinyl butyral), poly(vinyl acetate), or polyvinylchloride; an epoxy resin; a xylene resin; an aramid resin; a polyurethane-based resin; a polyurea-based resin, a melamine resin; a phenol-based resin; polyether; an acrylic-based resin, and a copolymer of any of those resins can be given.

Further, a conductive composition may be doped with an acceptor dopant or a donor dopant, so that oxidation-reduction potential of a conjugated conductive macromolecule is changed and conductivity of the conductive composition is adjusted.

A halogen compound, a Lewis acid, a protonic acid, an organic cyano compound, an organometallic compound, or the like can be used as an acceptor dopant. Examples of a halogen compound are chlorine, bromine, iodine, iodine chloride, iodine bromide, and iodine fluoride. Examples of a Lewis acid are phosphorus pentafluoride, arsenic pentafluoride, antimony pentafluoride, boron trifluoride, boron trichloride, and boron tribromide. Examples of a protonic acid include an inorganic acid such as hydrochloric acid, sulfuric acid, nitric acid, phosphoric acid, fluoroboric acid, hydrofluoric acid, and perchloric acid; and an organic acid such as organic carboxylic acid and organic sulfonic acid. As an organic cyano compound, a compound having two or more cyano groups in a conjugated bonding, for example, tetracyanoethylene, tetracyanoethylene oxide, tetracyanobenzene, tetracyanoquinodimethane, and tetracyanoazanaphthalene can be given.

As a donor dopant, alkali metal, alkaline earth metal, a tertiary amine compound, and the like can be given.

As described above, a conductive composition is dissolved in water or an organic solvent (e.g., an alcohol-based solvent, a ketone-based solvent, an ester-based solvent, a hydrocarbon-based solvent, or an aromatic solvent), so that a thin film which serves as the pixel electrode layer 774 can be formed by an application method, a coating method, a droplet discharge method (also referred to as an ink-jet method), or a wet method such as a printing method.

Figure 10A:
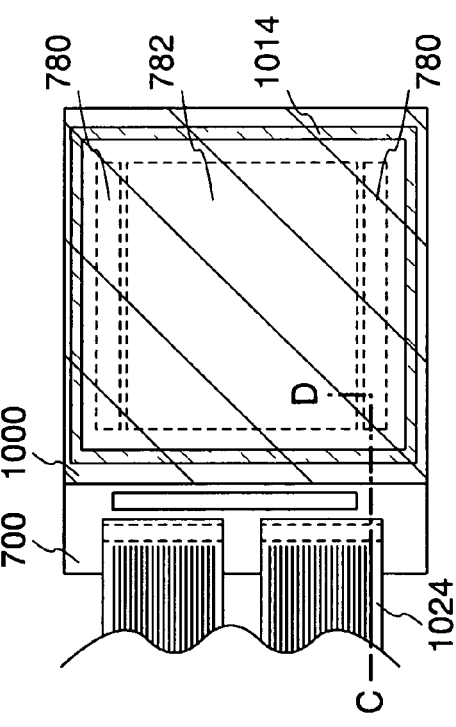
FIGS. 10A and 10B are a plan view and a cross-sectional view of a semiconductor device of the present invention, respectively.
Figure 10B:
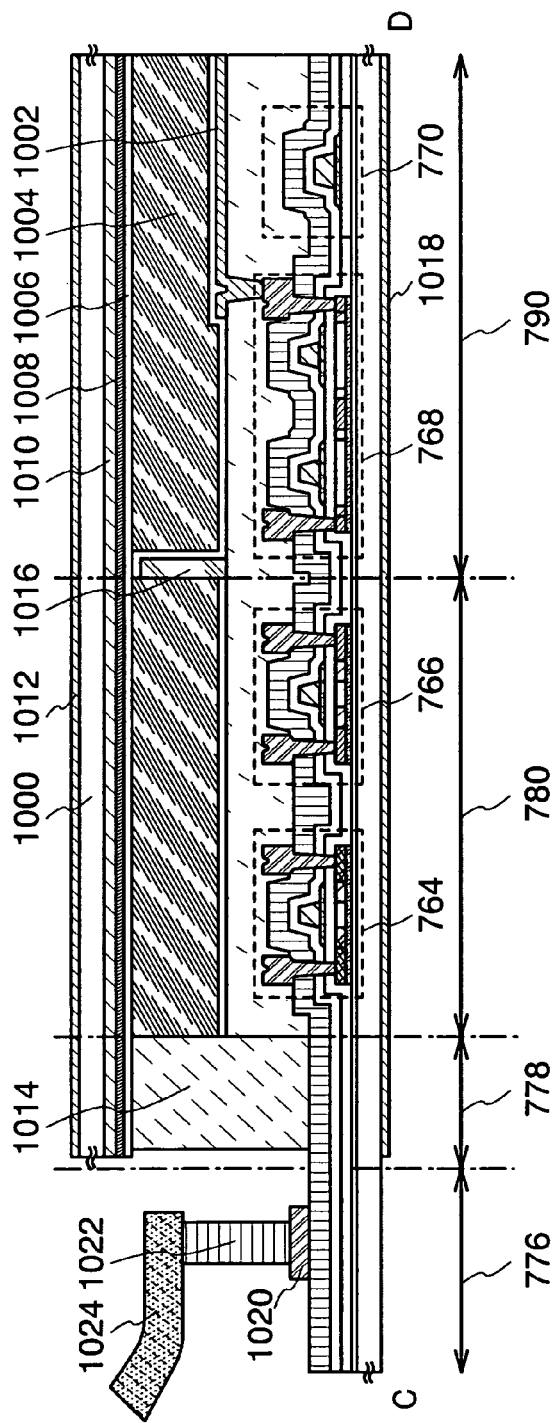

Next, an insulating layer 1002 which is referred to as an alignment film is formed so as to cover the pixel electrode layer 774 and the insulating film 772 (see FIG. 10B). The insulating layer 1002 can be formed by a screen printing method or an offset printing method. Note that FIGS. 10A and 10B illustrate a plan view and a cross-sectional view of a semiconductor device, respectively, and FIG. 10A is a plan view of a semiconductor device and FIG. 10B is a cross-sectional view taken along line C-D of FIG. 10A. In the semiconductor device, an external terminal connection region 776, a sealing region 778, the peripheral driver circuit region 780, and the pixel region 790 are provided.

After the insulating layer 1002 is formed, rubbing treatment is performed. An insulating layer 1006 which functions as an alignment film can also be formed in a manner similar to that of the insulating layer 1002.

After that, an opposite substrate 1000 and the substrate 700 having an insulating surface are attached to each other, with a sealant 1014 and a spacer 1016 interposed therebetween, and the space is provided with a liquid crystal layer 1004. Note that the opposite substrate 1000 is provided with an insulating layer 1006 which functions as an alignment film, a conductive layer 1008 which functions as an opposite electrode, a colored layer 1010 which functions as a color filter, a polarizer 1012 (also referred to as a polarizing plate), and the like. Note that a polarizer 1018 (a polarizing plate) is also provided to the substrate 700 having an insulating surface; however, the present invention is not limited to this structure. For example, a polarizer may be provided on one side in a reflective type liquid crystal display device.

Subsequently, an FPC 1024 is connected to a terminal electrode layer 1020 which is electrically connected to the pixel region, through an anisotropic conductive layer 1022. The FPC 1024 has a function of transmitting a signal from the external. Through the above-described steps, a liquid crystal display device can be manufactured.

In the present invention, laser light irradiation is performed on the front surface (the upper surface in the drawing) and the back surface (the lower surface in the drawing) of the single-crystal semiconductor layer 706, so that characteristics of the single-crystal semiconductor layer 706 are uniformed. Accordingly, a semiconductor element superior in characteristics can be manufactured in the pixel region and the peripheral driver circuit region. Specifically, in a transistor using a single-crystal semiconductor layer, a drain current ($I_d$)-gate voltage ($V_g$) curve can be smoothed. That is, a transistor superior in switching characteristics can be obtained.

With the use of the transistor superior in characteristics like in the present invention, reliability of various circuits can be improved. For example, since operating voltage can be reduced in the peripheral driver circuit, it is possible to achieve high-speed operation and low power consumption. In addition, since variation of current with respect to applied voltage is monotonous in the circuit of the pixel region, an accurate gray scale can be displayed, in addition to realization of high-speed operation and low power consumption. In other words, according to the present invention, a semiconductor device excellent in image quality and in characteristics for displaying moving image can be provided. Further, since the peripheral driver circuit and the like can be miniaturized and thinned, the thickness and the frame area of the semiconductor device can be reduced; thus, a semiconductor device in which a display region is efficiently utilized can be provided at low cost.

Note that a manufacturing method of a liquid crystal display device is described in this embodiment mode; however, the present invention is not limited thereto. This embodiment mode can be implemented by being combined with any of Embodiment Modes 1 and 2, as appropriate.

Embodiment Mode 4

This embodiment mode will describe a semiconductor device having a light-emitting element related to the present invention (an electroluminescence display device). Note that as to a manufacturing method of transistors which are used for a peripheral driver circuit, a pixel region, and the like, it is possible to refer to Embodiment Mode 3; thus, the details are omitted.

As to a semiconductor device having a light-emitting element, any one of bottom emission, top emission, and dual emission can be employed. This embodiment mode will describe a semiconductor device employing bottom emission with reference to FIGS. 11A and 11B; however, the present invention is not limited thereto.

In a semiconductor device illustrated in FIGS. 11A and 11B, light is emitted downwardly (in a direction indicated by an arrow). Here, FIG. 11A is a plan view of the semiconductor device, and FIG. 11B is a cross-sectional view taken along line E-F of FIG. 11A. In FIGS. 11A and 11B, the semiconductor device includes an external terminal connection region 1130, a sealing region 1132, a driver circuit region 1134, and a pixel region 1136.

The semiconductor device illustrated in FIGS. 11A and 11B includes an element substrate 1100, an insulating film 1102, thin film transistors 1150, 1152, 1154, and 1156, a light-emitting element 1160, an insulating layer 1168, a filler 1170, a sealant 1172, a wiring layer 1174, a terminal electrode layer 1176, an anisotropic conductive layer 1178, an FPC 1180, and a sealing substrate 1190. Note that the light-emitting element 1160 includes a first electrode layer 1162, a light-emitting layer 1164, and a second electrode layer 1166.

As the first electrode layer 1162, a light-transmitting conductive material is used so that light emitted from the light-emitting layer 1164 can be transmitted. On the other hand, as the second electrode layer 1166, a conductive material which can reflect light emitted from the light-emitting layer 1164 is used.

As the first electrode layer 1162, indium oxide containing tungsten oxide, indium zinc oxide containing tungsten oxide, indium oxide containing titanium oxide, indium tin oxide containing titanium oxide, or the like can be used. Note that indium tin oxide (ITO), indium zinc oxide (IZO), indium tin oxide added with silicon oxide (ITSO), or the like may also be used.

A conductive composition containing a conductive macromolecule (also referred to as a conductive polymer) can also be used as the first electrode layer 1162. Note that as to the details, it is possible to refer to Embodiment Mode 3; thus, the descriptions are omitted.

As the second electrode layer 1166, a conductive film formed of titanium, tungsten, nickel, gold, platinum, silver, copper, tantalum, molybdenum, aluminum, magnesium, calcium, lithium, or an alloy thereof may be used. A substance having high reflectivity in a visible region, and an aluminum film is used in this embodiment mode.

Note that in the case of employing each of top emission and dual emission, the design of the electrode layers may be changed, as appropriate. Specifically, in the case of top emission, the first electrode layer 1162 is formed using a reflective material, and the second electrode layer 1166 is formed using a light-transmitting material. In the case of dual emission, the first electrode layer 1162 and the second electrode layer 1166 may be formed using a light-transmitting material. Note that in the case of bottom emission and top emission, a structure may be employed in which one electrode layer is formed using a light-transmitting material and the other electrode layer is formed in a stacked-layer structure of a light-transmitting material and a light-reflecting material. The material that can be used for the electrode layers is similar to the material in the case of bottom emission; thus, the descriptions are omitted.

Note that even in the case of such a material as a metal film without a light-transmitting property, light can be transmitted by reduction in film thickness (approximately greater than or equal to 5 nm and less than or equal to 30 nm). Accordingly, an electrode layer which transmits light can also be formed using the above-described light-reflecting material.

The sealing substrate 1190 may be provided with a color filter (a colored layer). The color filter (a colored layer) can be formed by an evaporation method or a droplet discharge method. Alternatively, a color conversion layer may be used.

In the present invention, laser light irradiation is performed on the front surface (the upper surface in the drawing) and the back surface (the lower surface in the drawing) of the single-crystal semiconductor layer, so that characteristics of the single-crystal semiconductor layer are uniformed. Accordingly, a semiconductor element superior in characteristics can be manufactured in the pixel region and the peripheral driver circuit region. Specifically, in a transistor using a single-crystal semiconductor layer, a drain current ($I_d$)-gate voltage ($V_g$) curve can be smoothed. That is, a transistor superior in switching characteristics can be obtained.

With the use of the transistor superior in characteristics like in the present invention, reliability of various circuits can be improved. For example, since operating voltage can be reduced in the peripheral driver circuit, it is possible to achieve high-speed operation and low power consumption. In addition, since variation of current with respect to applied voltage is monotonous in the circuit of the pixel region, an accurate gray scale can be displayed, in addition to achievement of high-speed operation and low power consumption. In other words, according to the present invention, a semiconductor device superior in image quality and in characteristics for displaying moving image can be provided. Further, since the peripheral driver circuit and the like can be miniaturized and thinned, the thickness and the frame area of the semiconductor device can be reduced; thus, a semiconductor device in which a display region is effectively utilized can be provided at low cost.

Note that this embodiment mode is described using an electroluminescence display device; however, the present invention is not limited thereto. This embodiment mode can be implemented by being combined with any of Embodiment Modes 1 to 3, as appropriate.

Embodiment Mode 5

Figure 12:
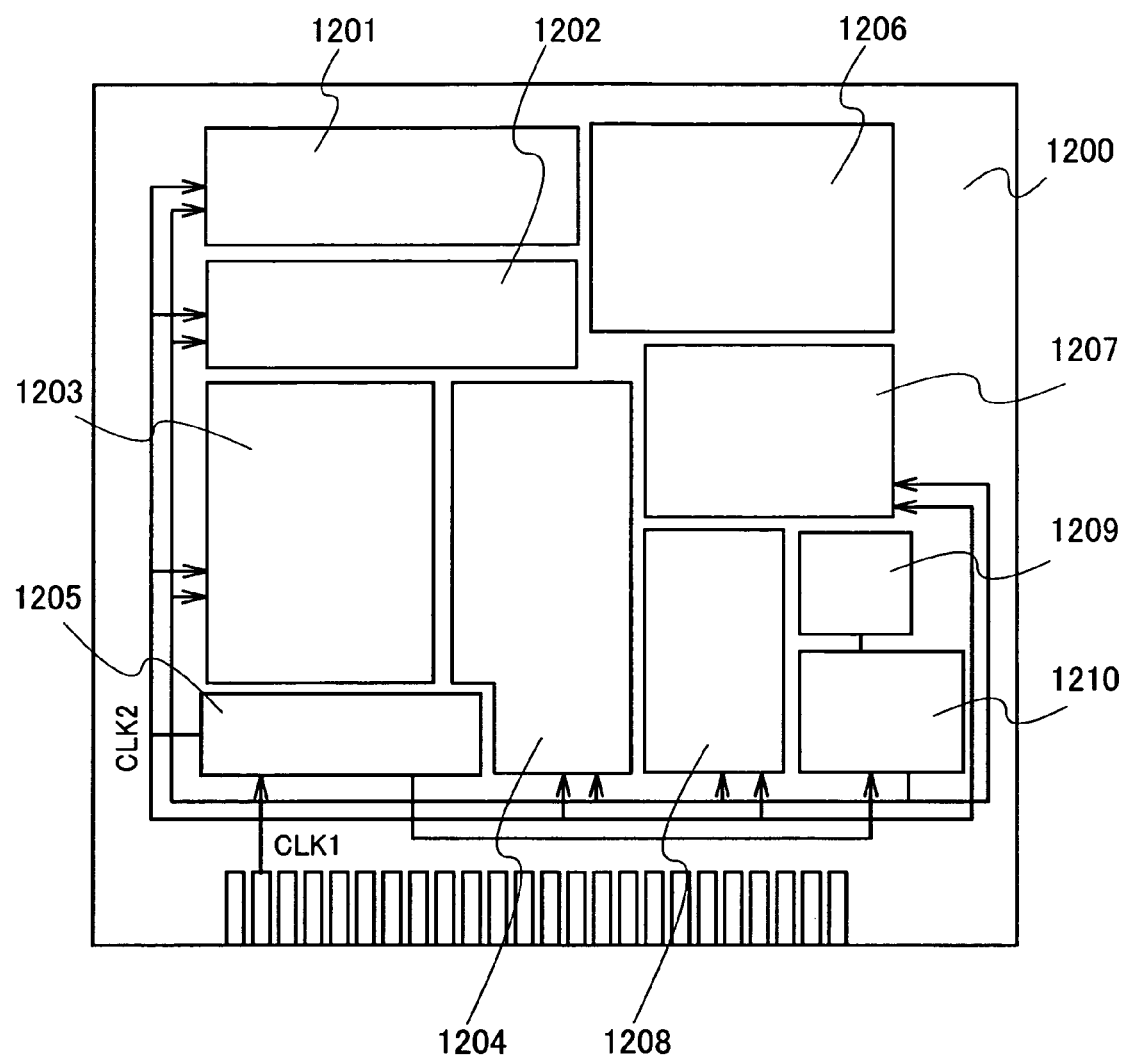
FIG. 12 is a diagram illustrating a configuration of a semiconductor device of the present invention.
Figure 13:
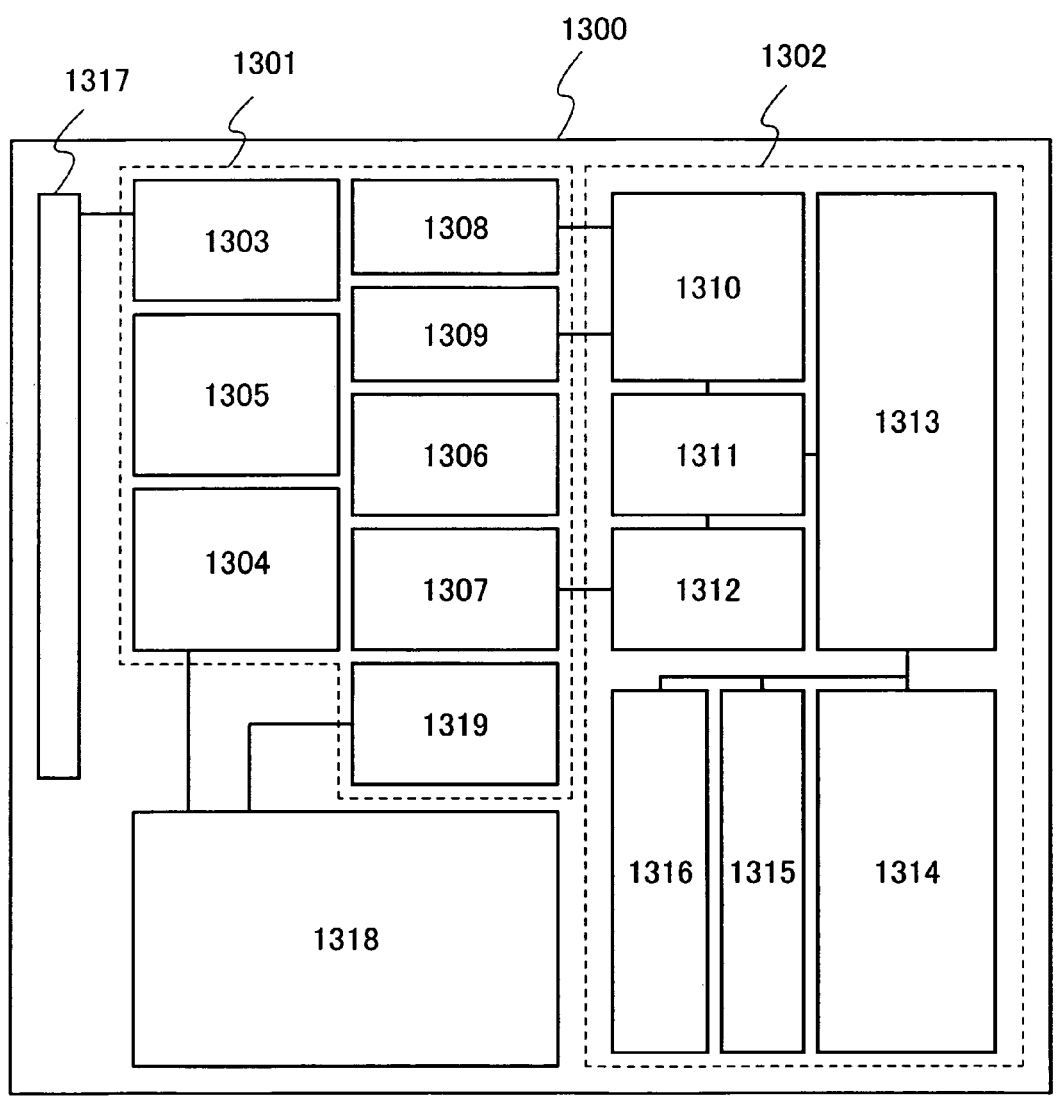
FIG. 13 is a diagram illustrating a configuration of a semiconductor device of the present invention.

This embodiment mode will describe another example of a semiconductor device related to the present invention with reference to FIGS. 12 and 13. Note that a microprocessor and an electronic tag are given as examples in this embodiment mode; however, a semiconductor device of the present invention is not limited thereto.

FIG. 12 illustrates a structural example of a microprocessor of the present invention. A microprocessor 1200 is manufactured using the semiconductor substrate of the present invention. The microprocessor 1200 has an arithmetic logic unit (ALU) 1201, an ALU controller 1202, an instruction decoder 1203, an interrupt controller 1204, a timing controller 1205, a register 1206, a register controller 1207, a bus interface (Bus I/F) 1208, a read only memory (ROM) 1209, and a memory interface (ROM I/F) 1210.

An instruction inputted to the microprocessor 1200 through the bus interface 1208 is inputted to the instruction decoder 1203 and decoded. Then, the instruction is inputted to the ALU controller 2102, the interrupt controller 1204, the register controller 1207, and the timing controller 1205. The ALU controller 1202, the interrupt controller 1204, the register controller 1207, and the timing controller 1205 perform various controls based on the decoded instruction. Specifically, the ALU controller 1202 generates a signal for controlling the operation of the arithmetic logic unit 1201. The interrupt controller 1204 judges an interrupt request from an external input/output device or a peripheral driver circuit based on its priority or a mask state, and processes the request while a program is executed in the microprocessor 1200. The register controller 1207 generates an address of the register 1206, and reads/writes data from/to the register 1206 depending on the state of the microprocessor 1200. The timing controller 1205 generates signals for controlling timing of driving of the arithmetic logic unit 1201, the ALU controller 1202, the instruction decoder 1203, the interrupt controller 1204, and the register controller 1207. For example, the timing controller 1205 is provided with an internal clock generator for generating an internal clock signal CLK2 based on a reference clock signal CLK1, and supplies the clock signal CLK2 to each of the above-mentioned various circuits. Note that the structure of the microprocessor 1200 illustrated in FIG. 12 is just an example, and the structure can be changed as appropriate, depending on usage.

Since an integrated circuit in the microprocessor 1200 of the present invention is formed using a single-crystal semiconductor layer whose crystals are oriented in a certain direction and which is bonded to a substrate having an insulating surface, higher processing speed and lower power consumption can be achieved. Further, in the microprocessor 1200 which is manufactured using the semiconductor substrate of the present invention, crystallinity, an activation rate, or the like of a single-crystal semiconductor layer is uniformed, which is contributed by laser light irradiation on the front surface and the back surface of the single-crystal semiconductor layer. Accordingly, characteristics of a semiconductor element are improved; thus, a microprocessor having extremely high performance and high reliability can be provided.

Next, an example of a semiconductor device which has an arithmetic function and can transmit and receive data without contact is described with reference to FIG. 13. FIG. 13 illustrates an example of a wireless tag which transmits and receives signals to/from an external device by wireless communication. Note that the wireless tag of the present invention includes a central processing unit (CPU), i.e., a miniaturized computer. A wireless tag 1300 has an analog circuit portion 1301 and a digital circuit portion 1302. The analog circuit portion 1301 includes a resonance circuit 1303 having a resonant capacitor, a rectifier circuit 1304, a constant voltage circuit 1305, a reset circuit 1306, an oscillator circuit 1307, a demodulation circuit 1308, a modulation circuit 1309, and a power supply control circuit 1319. The digital circuit portion 1302 includes an RF interface 1310, a control register 1311, a clock controller 1312, a CPU interface 1313, a central processing unit (CPU) 1314, a random access memory (RAM) 1315, and a read only memory (ROM) 1316.

The operation of the wireless tag 1300 having such a structure is roughly described below. The resonance circuit 1303 generates induced electromotive force when an antenna 1317 receives a signal. The induced electromotive force is stored in a capacitor portion 1318 via the rectifier circuit 1304. The capacitor portion 1318 is preferably formed using a capacitor such as a ceramic capacitor or an electric double layer capacitor. The capacitor portion 1318 may be formed over the same substrate as the wireless tag 1300 or may be attached, as another component, to a substrate having an insulating surface that partially constitutes the wireless tag 1300.

The reset circuit 1306 generates a signal that resets the digital circuit portion 1302 to be initialized. For example, the reset circuit 1306 generates, as a reset signal, a signal that rises with delay after increase in the power supply voltage. The oscillator circuit 1307 changes the frequency and the duty ratio of a clock signal depending on a control signal generated by the constant voltage circuit 1305. The demodulation circuit 1308 having a low pass filter, for example, binarizes variations in amplitude of reception signals of an amplitude shift keying (ASK) system. The modulation circuit 1309 varies the amplitude of transmission signals of an amplitude shift keying (ASK) system to be transmitted. The modulation circuit 1309 varies the resonance point of the resonance circuit 1303, thereby varying the amplitude of communication signals. The clock controller 1312 generates a control signal for changing the frequency and the duty ratio of the clock signal depending on the power supply voltage or current consumption in the central processing unit 1314. The power supply voltage is monitored by the power supply control circuit 1319.

A signal that is inputted to the wireless tag from the antenna 1317 is demodulated by the demodulation circuit 1308, and then divided into a control command, data, and the like by the RF interface 1310. The control command is stored in the control register 1311. The control command includes reading of data stored in the read only memory 1316, writing of data to the random access memory 1315, an arithmetic instruction to the central processing unit 1314, and the like. The central processing unit 1314 accesses the read only memory 1316, the random access memory 1315, and the control register 1311 via the interface 1313. The interface 1313 has a function of generating an access signal for any one of the read only memory 1316, the random access memory 1315, and the control register 1311 based on an address requested by the central processing unit 1314.

As an arithmetic method of the central processing unit 1314, a method may be employed in which the read only memory 1316 stores an operating system (OS) and a program is read at the time of starting operation and then executed. Alternatively, a method may be employed in which an arithmetic circuit is formed and an arithmetic processing is conducted using hardware. In a method in which both hardware and software are used, a method can be employed in which part of process is conducted in the circuit dedicated to arithmetic and the other part of the arithmetic process is conducted by the central processing unit 1314 using a program.

Since an integrated circuit in the wireless tag 1300 of the present invention is formed using a single-crystal semiconductor layer whose crystals are oriented in a certain direction and which is bonded to a substrate having an insulating surface, higher processing speed and lower power consumption can be achieved. Further, in the wireless tag 1300 which is manufactured using the semiconductor substrate of the present invention, crystallinity, an activation rate, or the like of a single-crystal semiconductor layer is uniformed, which is contributed by laser light irradiation on the front surface and the back surface of the single-crystal semiconductor layer. Accordingly, characteristics of a semiconductor element are improved; thus, a wireless tag having extremely high performance and high reliability can be provided.

Embodiment Mode 6

An electronic device using a semiconductor device of the present invention, in particular, a display device will be described with reference to FIGS. 14A to 14H.

Examples of electronic devices which are manufactured using a semiconductor device of the present invention include cameras such as a video camera and a digital camera, a goggle-type display (a head-mounted display), a navigation system, an audio reproducing device (such as car audio components), a computer, a game machine, a portable information terminal (such as a mobile computer, a cellular phone, a portable game machine, and an electronic book), an image reproducing device provided with a recording medium (specifically, a device for reproducing a recording medium such as a digital versatile disc (DVD) and having a display for displaying the reproduced image), and the like.

Figure 14A:
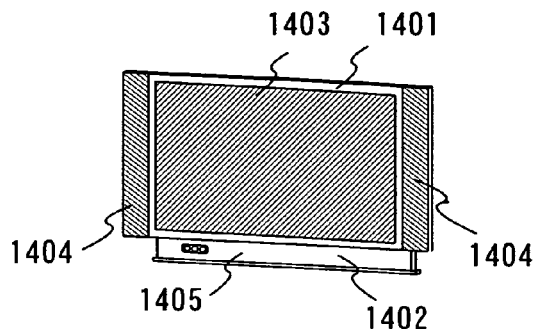
FIGS. 14A to 14H are views each illustrating an electronic device using a semiconductor device of the present invention.

FIG. 14A illustrates a monitor of a television device or a personal computer, which includes a housing 1401, a support base 1402, a display portion 1403, speaker portions 1404, a video input terminal 1405, and the like. A semiconductor device of the present invention is used for the display portion 1403. According to the present invention, a high-performance and highly reliable television device or personal computer can be provided.

Figure 14B:
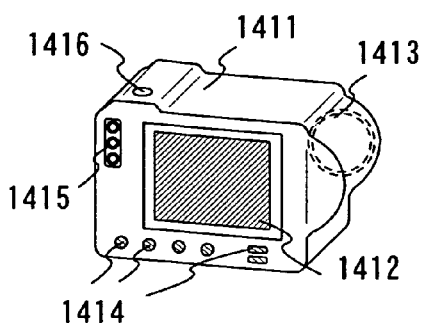

FIG. 14B illustrates a digital camera. An image receiving portion 1413 is provided in the front side of a main body 1411. A shutter button 1416 is provided at the upper portion of the main body 1411. A display portion 1412, operation keys 1414, and an external connection port 1415 are provided at the backside of the main body 1411. A semiconductor device of the present invention is used for the display portion 1412. According to the present invention, a high-performance and highly reliable digital camera can be provided.

Figure 14C:
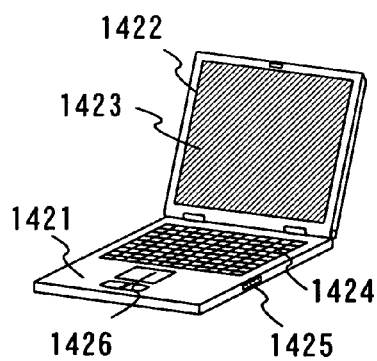

FIG. 14C illustrates a laptop personal computer. A main body 1421 is provided with a keyboard 1424, an external connection port 1425, and a pointing device 1426. A housing 1422 including a display portion 1423 is attached to the main body 1421. A semiconductor device of the present invention is used for the display portion 1423. According to the present invention, a high-performance and highly reliable laptop personal computer can be provided.

Figure 14D:
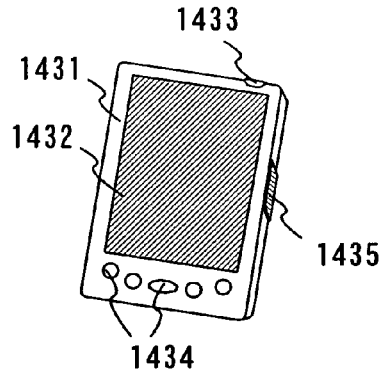

FIG. 14D illustrates a mobile computer, which includes a main body 1431, a display portion 1432, a switch 1433, operation keys 1434, an infrared port 1435, and the like. An active matrix display device is provided for the display portion 1432. A semiconductor device of the present invention is used for the display portion 1432. According to the present invention, a high-performance and highly reliable mobile computer can be provided.

Figure 14E:
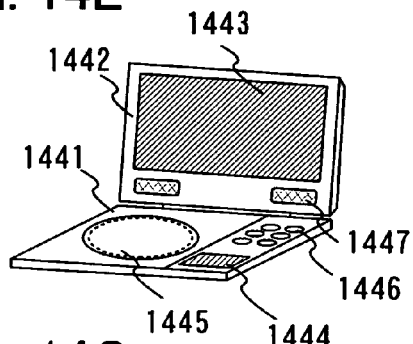

FIG. 14E illustrates an image reproducing device. A main body 1441 is provided with a display portion B 1444, a recording medium reading portion 1445, and operation keys 1446. A housing 1442 including a speaker portion 1447 and a display portion A 1443 is attached to the main body 1441. A semiconductor device of the present invention is used for each of the display portion A 1443 and the display portion B 1444. According to the present invention, a high-performance and highly reliable image reproducing device can be provided.

Figure 14F:
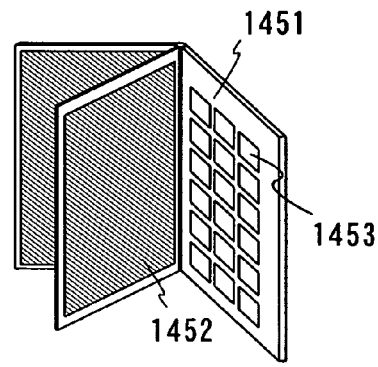

FIG. 14F illustrates an electronic book. A main body 1451 is provided with operation keys 1453. A plurality of display portions 1452 are attached to the main body 1451. A semiconductor device of the present invention is used for the display portions 1452. According to the present invention, a high-performance and highly reliable electronic book can be provided.

Figure 14G:
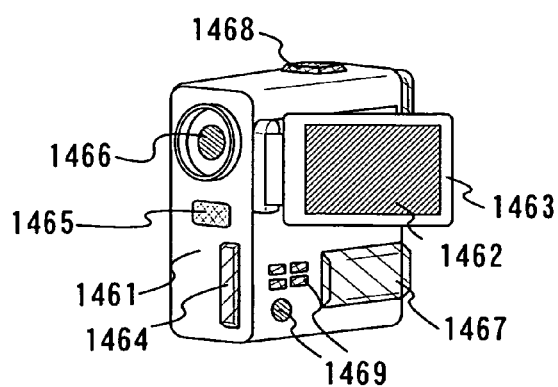

FIG. 14G illustrates a video camera. A main body 1461 is provided with an external connection port 1464, a remote control receiving portion 1465, an image receiving portion 1466, a battery 1467, an audio input portion 1468, and operation keys 1469. A housing 1463 including a display portion 1462 is attached to the main body 1461. A semiconductor device of the present invention is used for the display portion 1462. According to the present invention, a high-performance and highly reliable video camera can be provided.

Figure 14H:
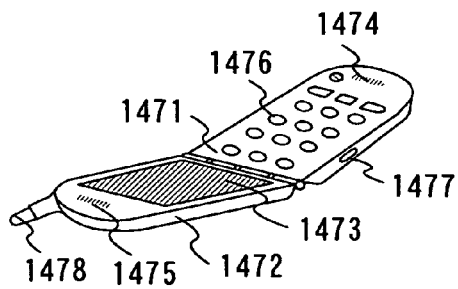
Figure 15A:
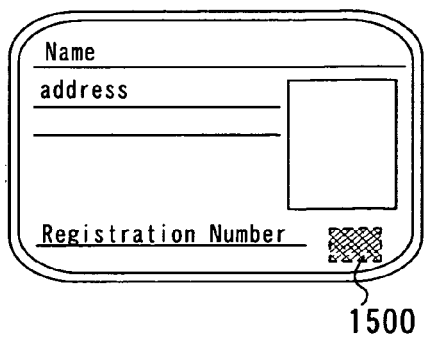
FIGS. 15A to 15F are views each illustrating an application of a semiconductor device of the present invention.
Figure 15B:
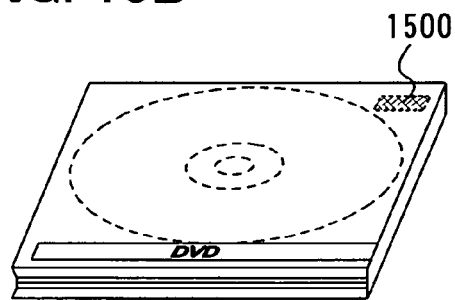
Figure 15C:
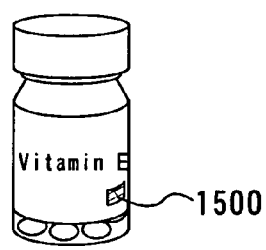
Figure 15D:
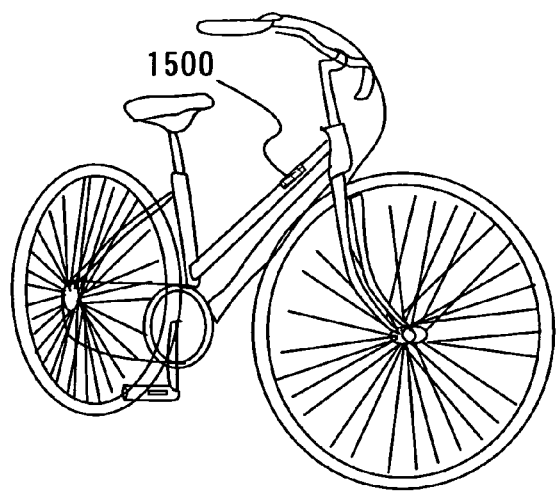
Figure 15E:
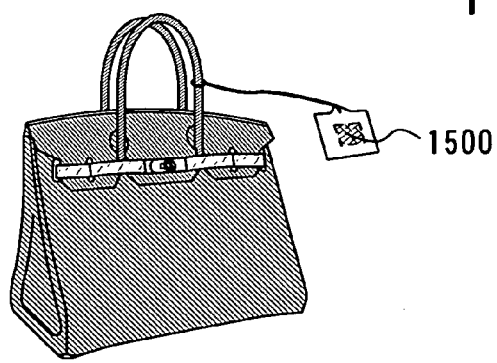
Figure 15F:
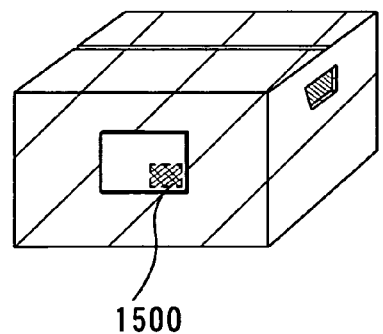
Figure 16A:
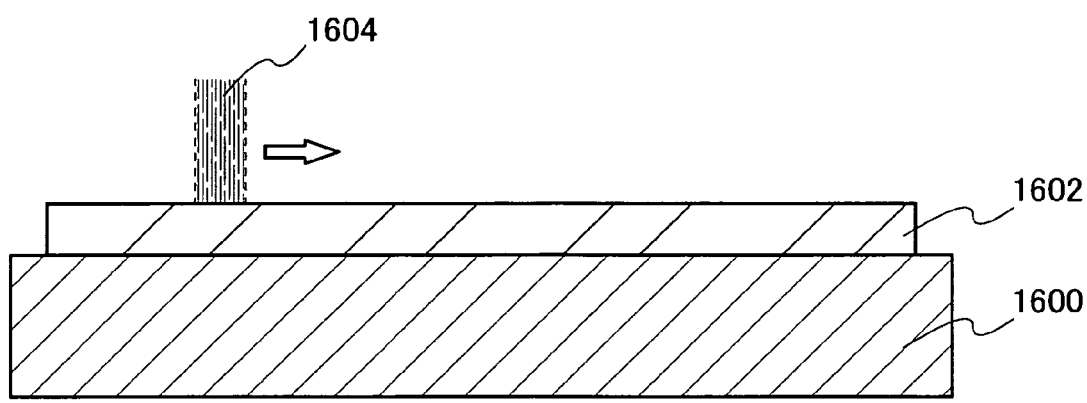
FIGS. 16A and 16B are cross-sectional views illustrating a manufacturing process of a semiconductor device.
Figure 16B:
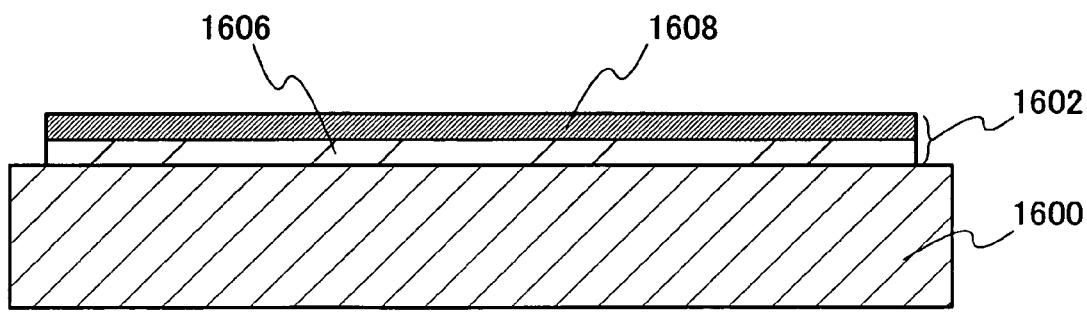
Figure 17A:
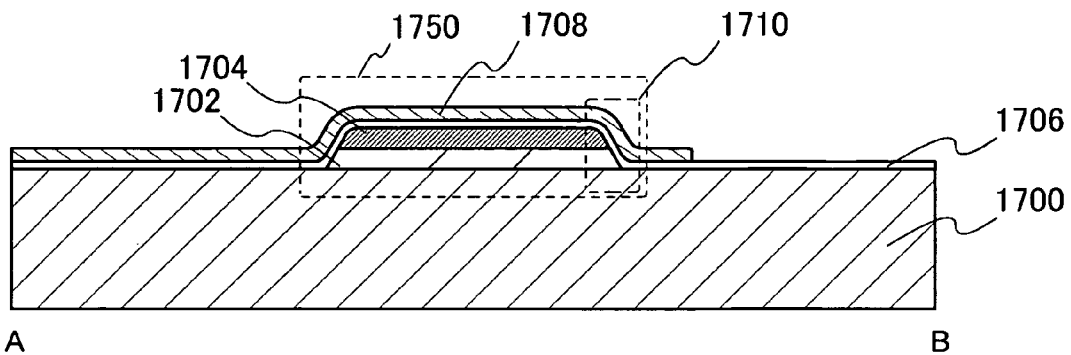
FIGS. 17A and 17B are a cross-sectional view and a plan view each illustrating a semiconductor device prepared by a known method, respectively.
Figure 17B:
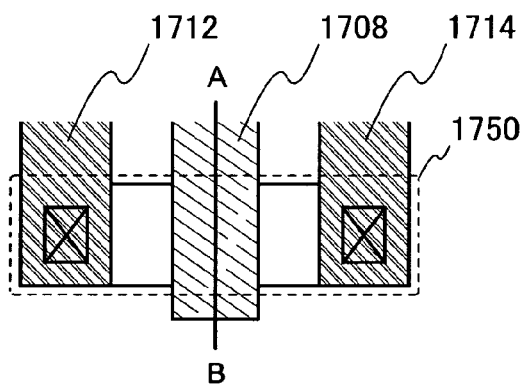
Figure 17C:
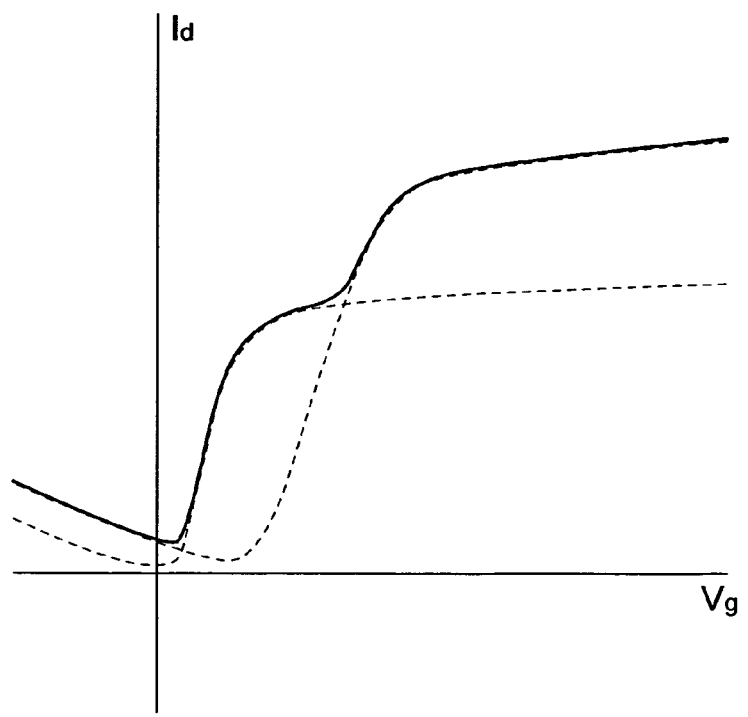
FIG. 17C is a schematic illustration of an $I_d$-$V_g$ curve of the semiconductor device.

FIG. 14H illustrates a cellular phone, which includes a main body 1471, a housing 1472, a display portion 1473, an audio input portion 1474, an audio output portion 1475, operation keys 1476, an external connection port 1477, an antenna 1478, and the like. A semiconductor device of the present invention is used for the display portion 1473. According to the present invention, a high-performance and highly reliable cellular phone can be provided.

As described above, the application range of the present invention is extremely wide and electronic devices of every field can be used. Note that this embodiment mode can be implemented by being combined with any of Embodiment Modes 1 to 5, as appropriate.

Embodiment Mode 7

This embodiment mode will describe applications of a semiconductor device, in particular, a wireless tag of the present invention with reference to FIGS. 15A to 15F.

According to the present invention, a semiconductor device which functions as a wireless tag can be formed. A wireless tag can be used in a wide variety of applications, and may be used by being mounted on objects such as bills, coins, securities, bearer bonds, certificates (driver's licenses, resident cards, and the like, see FIG. 15A), containers for wrapping objects (wrapping paper, bottles, and the like, see FIG. 15C), recording media (DVD software, video tapes, and the like, see FIG. 15B), vehicles (bicycles and the like, see FIG. 15D), personal belongings (bags, glasses, and the like), foods, plants, clothes, lifestyle goods, and products such as electronic devices, or shipping tags of baggage (see FIGS. 15E and 15F). Note that the wireless tags are denoted by reference numeral 1500 in FIGS. 15A to 15F.

Note that the electronic device refers to objects shown in Embodiment Mode 6 as well as a liquid crystal display device, an EL display device, a television unit (also simply referred to as a TV, a TV receiver, or a television receiver), a cellular phone, and the like, for example. In addition, the above-described semiconductor device can be used for animals, human bodies, or the like.

The wireless tag is attached to a surface of an object, or incorporated to be fixed on an object. For example, the wireless tag may be incorporated in paper of a book, or an organic resin of a container for wrapping an object to be fixed on each object. By providing the wireless tag in bills, coins, securities, bearer bonds, certificates, and the like, forgery can be prevented. Further, by providing the wireless tag in containers for wrapping objects, recording media, personal belongings, foods, clothes, lifestyle goods, electronic devices, and the like, inspection systems, rental systems and the like can be performed more efficiently. The wireless tag that can be formed according to the present invention has high performance and high reliability, and can be applied to various objects.

When the wireless tag that can be formed according to the present invention is applied to management system or a distribution system of articles, the system can have high functionality. For example, information which is recorded in the wireless tag provided in a tag is read by a reader/writer provided near a conveyor belt, then information about a distribution process or a delivery destination is read out, and inspection of merchandise or distribution of goods can be easily carried out.

As described above, the application range of the present invention is extremely wide and the present invention can be applied to objects of every field. Note that this embodiment mode can be implemented by being combined with any of Embodiment Modes 1 to 6, as appropriate.

The present application is based on Japanese Patent Application serial No. 2007-167356 filed with Japan Patent Office on Jun. 26, 2007, the entire contents of which are hereby incorporated by reference.

What is claimed is:

1. A method for manufacturing a semiconductor substrate comprising the steps of:
    forming a damaged region in a single-crystal semiconductor substrate by ion irradiation of a first surface of the single-crystal semiconductor substrate;
    forming an insulating layer on the first surface of the single-crystal semiconductor substrate;
    bonding the insulating layer and a second substrate which has an insulating surface to each other;
    separating the single-crystal semiconductor substrate from the second substrate at the damaged region, allowing the insulating layer and a portion between the first surface and the damaged region to remain over the second substrate;
    irradiating a second substrate side of the portion with first laser light through the second substrate and the insulating layer, and
    irradiating the portion with second laser light from a side which is opposite to the second substrate side.

2. The method for manufacturing a semiconductor substrate according to claim 1,
    wherein the irradiation with first laser light and the irradiation with second laser light are performed after the separation of the single-crystal semiconductor substrate from the second substrate.

3. The method for manufacturing a semiconductor substrate according to claim 1,
    wherein the single-crystal semiconductor substrate is formed of a material selected from the group consisting of silicon, germanium, gallium arsenide, and indium phosphide.

4. The method for manufacturing a semiconductor substrate according to claim 1,
    wherein ion is selected from the group consisting of ions of a halogen and hydrogen.

5. The method for manufacturing a semiconductor substrate according to claim 1,
    wherein the formation of the insulating layer is performed by a chemical vapor deposition method using a gas selected from the group consisting of silane and an organic silane.

6. The method for manufacturing a semiconductor substrate according to claim 1,
    wherein the ion irradiation is performed using a mixture of $H^+$ ion, $H_2^+$ ion, and $H_3^+$ ion, and
    wherein the mixture has an increased proportion of $H_3^+$.

7. The method for manufacturing a semiconductor substrate according to claim 1,
    wherein pressure is applied between the single-crystal semiconductor substrate and the second substrate when the bonding step is performed.

8. The method for manufacturing a semiconductor substrate according to claim 1,
    wherein the method further comprises a step of irradiating a surface of the insulating layer with an atomic beam before the bonding step.

9. The method for manufacturing a semiconductor substrate according to claim 1,
    wherein the method further comprises a step of performing plasma treatment or radical treatment on a surface of the insulating layer.

10. The method for manufacturing a semiconductor substrate according to claim 1,
    wherein the steps of irradiating with first laser light and second laser light are performed using an excimer laser.

11. The method for manufacturing a semiconductor substrate according to claim 1,
    wherein first laser light and second laser light have a wavelength of 248 nm or 308 nm.

12. A method for manufacturing a semiconductor substrate comprising the steps of:
    forming a damaged region in a single-crystal semiconductor substrate by ion irradiation of a first surface of the single-crystal semiconductor substrate;

forming an insulating layer on a surface of a second substrate having an insulating surface;

bonding the first surface of the single-crystal semiconductor substrate and the insulating layer to each other;

separating the single-crystal semiconductor substrate from the second substrate at the damaged region, allowing the insulating layer and a portion between the first surface and the damaged region to remain over the second substrate;

irradiating a second substrate side of the portion with first laser light through the second substrate and the insulating layer, and irradiating the portion with second laser light from a side which is opposite to the second substrate side.

13. The method for manufacturing a semiconductor substrate according to claim 12,
wherein the irradiation with first laser light and the irradiation with second laser light are performed after the separation of the single-crystal semiconductor substrate from the second substrate.

14. The method for manufacturing a semiconductor substrate according to claim 12,
wherein the single-crystal semiconductor substrate is formed of a material selected from the group consisting of silicon, germanium, gallium arsenide, and indium phosphide.

15. The method for manufacturing a semiconductor substrate according to claim 12,
wherein ion is selected from the group consisting of ions of a halogen and hydrogen.

16. The method for manufacturing a semiconductor substrate according to claim 12,
wherein the formation of the insulating layer is performed by a chemical vapor deposition method using a gas selected from the group consisting of silane and an organic silane.

17. The method for manufacturing a semiconductor substrate according to claim 12,
wherein the ion irradiation is performed using a mixture of $H^+$ ion, $H_2^+$ ion, and $H_3^+$ ion, and
wherein the mixture has an increased proportion of $H_3^+$.

18. The method for manufacturing a semiconductor substrate according to claim 12,
wherein pressure is applied between the single-crystal semiconductor substrate and the second substrate when the bonding step is performed.

19. The method for manufacturing a semiconductor substrate according to claim 12,
wherein the method further comprises a step of irradiating a surface of the insulating layer with an atomic beam before the bonding step.

20. A method for manufacturing a semiconductor substrate comprising the steps of:
forming a first insulating layer over a first surface of a single-crystal semiconductor substrate;
forming a damaged region in the single-crystal semiconductor substrate by ion irradiation of the first surface of the single-crystal semiconductor substrate;
forming a second insulating layer over the first insulating layer;
bonding the second insulating layer and a second substrate having an insulating surface to each other;
separating the single-crystal semiconductor substrate from the second substrate at the damaged region, allowing the first insulating layer, the second insulating layer, and a portion between the first surface and the damaged region to remain over the second substrate;

irradiating a second substrate side of the portion with first laser light through the second substrate, the first insulating layer, and the second insulating layer, and irradiating the portion with second laser light from a side which is opposite to the second substrate side.

21. The method for manufacturing a semiconductor substrate according to claim 20,
wherein the irradiation with first laser light and the irradiation with second laser light are performed after the separation of the single-crystal semiconductor substrate from the second substrate.

22. The method for manufacturing a semiconductor substrate according to claim 20,
wherein the single-crystal semiconductor substrate is formed of a material selected from the group consisting of silicon, germanium, gallium arsenide, and indium phosphide.

23. The method for manufacturing a semiconductor substrate according to claim 20,
wherein ion is selected from the group consisting of ions of a halogen and hydrogen.

24. The method for manufacturing a semiconductor substrate according to claim 20,
wherein the formation of the second insulating layer is performed by a chemical vapor deposition method using a gas selected from the group consisting of silane and an organic silane.

25. The method for manufacturing a semiconductor substrate according to claim 20,
wherein the first insulating layer is a nitrogen-containing insulating layer formed using a material selected from the group consisting of silicon nitride, silicon nitride oxide, and silicon oxynitride.

26. The method for manufacturing a semiconductor substrate according to claim 20,
wherein the method further comprises a step of performing plasma treatment or radical treatment on a surface of the second insulating layer.

27. The method for manufacturing a semiconductor substrate according to claim 20,
wherein the ion irradiation is performed using a mixture of $H^+$ ion, $H_2^+$ ion, and $H_3^+$ ion, and
wherein the mixture has an increased proportion of $H_3^+$.

28. The method for manufacturing a semiconductor substrate according to claim 20,
wherein pressure is applied between the single-crystal semiconductor substrate and the second substrate when the bonding step is performed.

29. The method for manufacturing a semiconductor substrate according to claim 20,
wherein the method further comprises a step of irradiating a surface of the first insulating layer with an atomic beam before the bonding step.

30. The method for manufacturing a semiconductor substrate according to claim 20,
wherein the method further comprises a step of performing plasma treatment or radical treatment on a surface of the first insulating layer.

31. A method for manufacturing a semiconductor substrate comprising the steps of:
forming a first insulating layer over a first surface of a single-crystal semiconductor substrate;
forming a damaged region in the single-crystal semiconductor substrate by ion irradiation of the first surface of the single-crystal semiconductor substrate;
forming a second insulating layer over a second substrate having an insulating surface;

bonding the first insulating layer and the second insulating layer to each other;

separating the single-crystal semiconductor substrate from the second substrate at the damaged region, allowing the first insulating layer, the second insulating layer, and a portion between the first surface and the damaged region to remain over the second substrate;

irradiating a second substrate side of the portion with first laser light through the second substrate, the first insulating layer, and the second insulating layer, and irradiating the portion with second laser light from a side which is opposite to the second substrate side.

32. The method for manufacturing a semiconductor substrate according to claim 31, wherein the irradiation with first laser light and the irradiation with second laser light are performed after the separation of the single-crystal semiconductor substrate from the second substrate.

33. The method for manufacturing a semiconductor substrate according to claim 31, wherein the single-crystal semiconductor substrate is formed of a material selected from the group consisting of silicon, germanium, gallium arsenide, and indium phosphide.

34. The method for manufacturing a semiconductor substrate according to claim 31, wherein ion is selected from the group consisting of ions of a halogen and hydrogen.

35. The method for manufacturing a semiconductor substrate according to claim 31, wherein the formation of the second insulating layer is performed by a chemical vapor deposition method using a gas selected from the group consisting of silane and an organic silane.

36. The method for manufacturing a semiconductor substrate according to claim 31, wherein the first insulating layer is a nitrogen-containing insulating layer formed using a material selected from the group consisting of silicon nitride, silicon nitride oxide, and silicon oxynitride.

37. The method for manufacturing a semiconductor substrate according to claim 31, wherein the ion irradiation is performed using a mixture of $H^+$ ion, $H_2^+$ ion, and $H_3^+$ ion, and wherein the mixture has an increased proportion of $H_3^+$.

38. The method for manufacturing a semiconductor substrate according to claim 31, wherein pressure is applied between the single-crystal semiconductor substrate and the second substrate when the bonding step is performed.

39. The method for manufacturing a semiconductor substrate according to claim 31, wherein the method further comprises a step of irradiating a surface of the first insulating layer with an atomic beam before the bonding step.

40. The method for manufacturing a semiconductor substrate according to claim 31, wherein the method further comprises a step of performing plasma treatment or radical treatment on a surface of the first insulating layer.

* * * * *